(12) United States Patent
Hiramatsu

(10) Patent No.: US 7,462,802 B2
(45) Date of Patent: Dec. 9, 2008

(54) LASER MACHINING APPARATUS, AND APPARATUS AND METHOD FOR MANUFACTURING A MULTILAYERED PRINTED WIRING BOARD

(75) Inventor: Yasuji Hiramatsu, Ibi-gun (JP)

(73) Assignee: Ibiden Co., Ltd., Ogaki-Shi (JP)

(*) Notice: Subject to any disclaimer, the term of this patent is extended or adjusted under 35 U.S.C. 154(b) by 0 days.

(21) Appl. No.: 11/356,259

(22) Filed: Feb. 17, 2006

(65) Prior Publication Data
US 2006/0138098 A1    Jun. 29, 2006

Related U.S. Application Data

(62) Division of application No. 10/863,753, filed on Jun. 9, 2004, which is a division of application No. 09/101,833, filed as application No. PCT/JP97/04168 on Nov. 14, 1997.

(30) Foreign Application Priority Data

| Nov. 20, 1996 | (JP) | ............ 08-326091 |
| Nov. 20, 1996 | (JP) | ............ 08-326092 |
| Dec. 27, 1996 | (JP) | ............ 08-358910 |
| Dec. 27, 1996 | (JP) | ............ 08-358911 |

(51) Int. Cl.
*B23K 26/38* (2006.01)
*B23K 26/03* (2006.01)

(52) U.S. Cl. .............. 219/121.71; 219/121.62
(58) Field of Classification Search ............ 219/121.7, 219/121.71, 121.62, 121.83; 382/151
See application file for complete search history.

(56) References Cited

U.S. PATENT DOCUMENTS

| 3,792,287 A | 2/1974 | Roland et al. |
| 4,708,545 A | 11/1987 | Fujii et al. |
| 4,720,798 A | 1/1988 | Reed et al. |
| 4,761,561 A | 8/1988 | Fujiwara et al. |

(Continued)

FOREIGN PATENT DOCUMENTS

EP    80651    6/1983

(Continued)

OTHER PUBLICATIONS

"Electronic Material," vol. 10, Aug. 1, 1996, 10 pages.

(Continued)

*Primary Examiner*—Geoffrey S. Evans
(74) *Attorney, Agent, or Firm*—Oblon, Spivak, McClelland, Maier & Neustadt, P.C.

(57) ABSTRACT

There is provided a laser processing apparatus, a multilayer printed wiring board manufacturing apparatus, and a manufacturing method to form via holes of ultra-fine diameter. The laser beam from the $CO_2$ laser oscillator (60) is converted to the shortened wavelength beam by a tellurium crystal (94) to control diffraction of the laser beam. Simultaneously, when the laser beam is condensed, a limit value of the condensation limit is reduced. Thereby, the spot diameter of laser beam is reduced and a hole for via hole is bored on the interlayer insulation resin on a substrate (10). Therefore, even when the laser beam output is raised to form a deeper hole, the hole diameter is not widened and thereby a hole for a small diameter via hole can be formed.

9 Claims, 17 Drawing Sheets

U.S. PATENT DOCUMENTS

| | | | |
|---|---|---|---|
| 4,852,115 A | 7/1989 | Viherkoski | |
| 4,979,180 A | 12/1990 | Munchervan | |
| 5,010,232 A | 4/1991 | Arai et al. | |
| 5,063,280 A | 11/1991 | Inagawa et al. | |
| 5,073,687 A | 12/1991 | Inagawa et al. | |
| 5,111,406 A | 5/1992 | Zachman et al. | |
| 5,144,681 A | 9/1992 | Kitakado et al. | |
| 5,191,699 A | 3/1993 | Ganslmeier et al. | |
| 5,227,013 A | 7/1993 | Kumar | |
| 5,250,843 A * | 10/1993 | Eichelberger | 257/692 |
| 5,266,380 A * | 11/1993 | Renguso et al. | 428/192 |
| 5,282,312 A | 2/1994 | DiStefano et al. | |
| 5,294,975 A | 3/1994 | Norman et al. | |
| 5,298,717 A | 3/1994 | Derossett, Jr. | |
| 5,337,151 A * | 8/1994 | Baxter et al. | 356/401 |
| 5,355,247 A | 10/1994 | Byer et al. | |
| 5,377,404 A | 1/1995 | Edward | |
| 5,393,359 A * | 2/1995 | Chang et al. | 156/64 |
| 5,401,909 A | 3/1995 | Arnold et al. | |
| 5,430,816 A | 7/1995 | Furuya et al. | |
| 5,522,683 A | 6/1996 | Kakimoto et al. | |
| 5,529,441 A | 6/1996 | Kosmowski et al. | |
| 5,532,520 A | 7/1996 | Haraguchi et al. | |
| 5,548,372 A | 8/1996 | Schroeder et al. | |
| 5,563,730 A | 10/1996 | Singh et al. | |
| 5,582,745 A | 12/1996 | Hans et al. | |
| 5,640,761 A | 6/1997 | DiStefano et al. | |
| 5,655,030 A * | 8/1997 | Suzuki | 382/152 |
| 5,670,067 A | 9/1997 | Koide et al. | |
| 5,690,846 A | 11/1997 | Okada et al. | |
| 5,751,585 A | 5/1998 | Cutler et al. | |
| 5,764,485 A | 6/1998 | Lebaschi | |
| 5,768,107 A | 6/1998 | Ouchi et al. | |
| 5,780,807 A | 7/1998 | Saunders | |
| 5,811,754 A | 9/1998 | Nakatani et al. | |
| 5,841,099 A | 11/1998 | Owen et al. | |
| 5,898,227 A | 4/1999 | Geffken et al. | |
| 6,091,026 A * | 7/2000 | Yang | 174/255 |
| 6,211,485 B1 | 4/2001 | Burgess | |
| 6,256,121 B1 | 7/2001 | Lizotte et al. | |

FOREIGN PATENT DOCUMENTS

| | | |
|---|---|---|
| EP | 0 223 066 A1 | 5/1987 |
| EP | 426600 | 5/1991 |
| EP | 0 657 917 A1 | 6/1995 |
| EP | 669792 | 8/1995 |
| JP | 59-189090 | 10/1984 |
| JP | 61-020683 | 1/1986 |
| JP | 61-033786 | 2/1986 |
| JP | 61-125715 | 6/1986 |
| JP | 62-004503 | 1/1987 |
| JP | 62-024906 | 2/1987 |
| JP | 02-054996 | 2/1990 |
| JP | 02-170595 | 7/1990 |
| JP | 3-11571 A * | 1/1991 |
| JP | 03-050372 | 5/1991 |
| JP | 03-268316 | 11/1991 |
| JP | 04-073996 | 3/1992 |
| JP | 04-115517 | 4/1992 |
| JP | 04-157470 | 5/1992 |
| JP | 05-211398 | 8/1993 |
| JP | 05-318160 | 12/1993 |
| JP | 06-269969 | 9/1994 |
| JP | 7-32183 A * | 2/1995 |
| JP | 07-171796 | 7/1995 |
| JP | 7-171796 A * | 7/1995 |
| JP | 07-273458 | 10/1995 |
| JP | 07-290396 | 11/1995 |
| JP | 08-153976 | 6/1996 |
| JP | 08-340165 | 12/1996 |
| JP | 09/248688 | 9/1997 |
| JP | 09-308983 | 12/1997 |
| WO | WO 9602351 A1 | 2/1996 |

OTHER PUBLICATIONS

"Electronic Material," vol. 4, Apr. 1996, 12 pages.
Notice of Shipment and Delivery, dated Sep. 19, 1996, 5 pages.
Report on the Completion of a Laser Processing Machine, dated Sep. 1996, 3 pages.
Mitsubishi ML50GT Catalog, Jun. 1996, 2 pages.
Mitsubishi LCP1 Specification, Sep. 1996, pp. 1-43.
Mitsubishi LCP1 Supplemental Specification, Sep. 1996, pp. 1-20.
Specification on Mitsubishi Carbon Dioxide Gas Laser Processing Machine, MLG505GT-5003D, Aug. 1996, pp. 1-11.
List on Calculation Program of M303 work gap, undated, 38 pages.
Patent Abstracts of Japan, JP 04-356389, Dec. 10, 1992.
Patent Abstracts of Japan, JP 07-032183, Feb. 3, 1995.
Patent Abstracts of Japan, JP 04-351280, Dec. 7, 1992.
Patent Abstracts of Japan, JP 02-217186, Aug. 29, 1990.
Patent Abstracts of Japan, JP 03-054884, Mar. 8, 1991.
Takeno et al., "Laser Drilling by High Peak Laser Pulsed CO2 Laser", Oct. 1992, ICALEO Laser Materials Processing - Proceedings of SPIE, The International Society for Optical Engineering, vol. 1990, pp. 459-468.

* cited by examiner

LASER MACHINING APPARATUS, AND APPARATUS AND METHOD FOR MANUFACTURING A MULTILAYERED PRINTED WIRING BOARD

CROSS REFERENCES TO RELATED APPLICATIONS

This application is a divisional of application No. 10/863,753, filed on Jun. 9, 1999, pending, which is divisional of application No. 09/101,833, filed on Jan. 29, 1999, pending, filed as 371 of international application No. PCT/JP97/04168, on Nov. 14, 1997.

BACKGROUND OF THE INVENTION

1. Field of the Invention

The present invention relates to a multilayer printed wiring board manufacturing apparatus and method and a laser processing apparatus, particularly to a multilayer printed wiring board manufacturing apparatus and method to form fine holes at a low cost and a laser processing apparatus.

2. Description of Related Art

A build-up multilayer wiring board alternately has interlayer resin insulators and conductive circuit layers, provides holes to the interlayer resin insulator layers and then electrically connects the upper layers and lower layers by forming conductive films at the wall surface of these holes.

A hole (via hole) of the interlayer resin insulating layer is generally formed through the exposure and developing process by giving photosensitive property to the interlayer resin.

However, the diameter of these via holes on the multilayer printed wiring board is almost 100 μm or less and it is expected to develop the technology to form the via hole having still smaller diameter. Because of such requirement employment of the processing method utilizing the laser beam for the boring of the build-up multilayer wiring board is now investigated.

A technology using laser for the boring is proposed for example, in the Japanese Published Examined Patent No. HEI 3-54884. In this technology, a light beam from the laser source is received by a processing head for deflection. Thereby the laser beam is irradiated to a predetermined resin insulator to form a through hole.

However, a multilayer wiring board has via holes in one layer in the number ranging from several hundreds to several tens of hundred and is also required to have higher positional accuracy because the via holes must be electrically connected with conductive circuits of the lower layer. Therefore, it has been required to enable the positioning of laser with higher accuracy in order to realize mass-production of the multilayer printed wiring board.

Namely, it is required to accurately measure the substrate position to embody the automatic control for mass production.

As a method of measuring the substrate position, an ordinary method has been introduced in which a positioning mark provided on the substrate is read with a camera to measure the position.

However, in the case of a multilayer printed wiring board, the positioning marks are often formed on a lower layer of the resin layer to be eliminated by a laser beam and if it is attempted to read the light beam reflected from the positioning mark under the resin layer, it is sometimes difficult to accurately read the reflected beam through reflection by the resin layer.

Therefore, the inventors of the present invention has proposed, as a method of accurately reading the positioning mark, to read the positioning mark from a silhouette by making use of the transmitting light beam of the light applied to the multilayer printed wiring board from the lower side.

However, since the multilayer printed wiring board is placed on an X-Y table, when the light is applied to the substrate from the lower side, it is thought that the table itself or a driver motor for driving the table will interfere the application of light beam.

Moreover, since the substrate is always moving by means of the X-Y table, it is also difficult to always apply the light beam from the lower side of the positioning mark which moves in combination with the X-Y table. Moreover, a problem like this arises not only in the multi layer printed wiring board but also in automatic laser process.

On the other hand, in order to bore the via holes and through holes of the multilayer printed wiring board, a laser beam in such a wavelength as generating heat in the interlayer resin must bemused and the $CO_2$ laser or excimer laser are considered as such laser source. The excimer laser has the wavelength as short as 248 nm in KrF, 308 nm in XeCL and 193 nm in ArF are and is suitable for formation of a small diameter via hole.

However, the excimer laser results in rise of product cost, when it is introduced into the industrial use, because the apparatus cost becomes high, and further parts such as lens are easily deteriorated because of short wavelength and these parts must be replaced frequently, and the expensive excimer gas must be supplemented and replaced within a short period.

Regarding this point, the $CO_2$ laser having a relatively longer wavelength is rather suitable for industrial use because not only output level is high and the apparatus cost is low but also repair of lens, for example, is not required and supplement of $CO_2$ laser can be realized at a low price, however when laser beam output is raised to form a deeper hole, hole diameter of via hole becomes larger. In addition, the hole in diameter of 100 μm which is about 10 times the wavelength (10.6 μm) can be bored easily but the hole in diameter of 50 μm or less which is about 5 times the wavelength is bored with considerable difficulty.

Such problem is generated also when the $CO_2$ laser is used as the laser source for processing, in addition to the multilayer printed wiring board.

Moreover, in the manufacturing apparatus of a multilayer printed wiring board of the related art, since several thousands to several tens of thousand via holes are bored in the multi layer printed wiring board, a longer time has been required to bore the holes of only one layer with the laser and the processing time becomes very long when such laser process is repeated for multiple layers.

It is an object of the present invention to provide an apparatus and a method of manufacturing a multilayer printed wiring board which, while securing the position accuracy of via holes, bore hundreds or thousands of holes by use of laser beam radiation.

It is therefore another object of the present invention to provide an apparatus and a method of manufacturing a multilayer printed wiring board which can form via holes of ultra-fine diameter at a low cost and also provide a laser processing apparatus which can form holes of ultra-fine diameter.

It is another object of the present invention to provide a laser processing apparatus, an apparatus and a method of manufacturing a multi layer printed wiring board which can read accurately the positioning marks.

It is further another object of the present invention to provide a laser processing apparatus which can reduce the processing time.

Moreover, it is still further another object of the present invention to provide an apparatus and a method of manufacturing a multilayer printed wiring board which can reduce the time required to form the via holes of a built-up type multilayer printed wiring board.

DISCLOSURE OF THE INVENTION

In order to attain the objects explained above, an apparatus of manufacturing a multilayer printed wiring board of claim 1 is characterized from the technical viewpoint that:

it is used for processing a multilayer printed wiring board having an interlayer resin insulator;

it comprises a processing laser source, a scanning head for deflecting the direction of laser beam toward the X-Y directions, a camera to read the positioning marks of the multilayer printed wiring board, an X-Y table for placing the multilayer printed wiring board, an input section for inputting the processing data of the multilayer printed wiring board, a memory section for storing the processing data or the arithmetic operations result, and an arithmetic operating section;

the processing data is input from the input section and this data is then stored in the memory section;

the positions of the positioning marks of the multilayer printed wiring board placed on the X-Y table is measured with the camera;

the processing data input on the basis of the measured position is corrected to generate the data to drive the scanning head and the X-Y table in the arithmetic operating section and this driver data is then stored in the memory section; and the drive data is read from the memory section in the control section and the laser beam is radiated to the multilayer printed wiring board by controlling the X-Y table and the scanning head to form the holes by eliminating the interlayer resin layer.

In order to attain the objects described above, the method of manufacturing a multilayer printed wiring board of claim 4 is characterized from the technical view point in comprising the steps of:

forming the positioning marks and interlayer insulating layer on the multilayer printed wiring board;

placing the multilayer printed wiring board having formed the positioning marks on the X-Y table of the multilayer printed wiring board manufacturing apparatus comprising the processing laser source, the scanning head for deflecting the direction of laser beam to the X-Y directions, the camera for reading the positioning marks on the multilayer printed wiring board, the X-Y table for placing the multilayer printed wiring board, the input section for inputting the processing data of the multilayer printed wiring board, the memory section for storing the processing data or the arithmetic operations result and the arithmetic operating section and also inputting the processing data to this apparatus;

measuring the positions of the positioning marks on the multilayer printed wiring board with the camera, correcting the input processing data based on the measured positions of the positioning marks in the arithmetic operating section to generate the data for driving the scanning head and X-Y table and storing this drive data to the memory section; and reading the drive data from the memory section in the control section radiating the laser beam to the multilayer printed wiring board by controlling the X-Y table and the scanning head to eliminate the interlayer resin layer in order to form the holes.

In the present invention, since position of the positioning mark is measured with a camera to actually measure the position of the substrate by forming in advance the positioning mark at the predetermined position of the multilayer printed wiring board, the position of the substrate is measured, and deviation of the substrate position is corrected from the input processing data and actually measured value of the substrate to generate the scanning head and X-Y table drive data. Thereby, the scanning head and the X-Y table are driven depending on this drive data. As a result, boring of many via holes of several hundreds to several tens of hundred can be realized while keeping the higher positional accuracy.

In the present invention, it is desirable that the positioning mark of the multilayer printed wiring board is formed of a metal conductor. It is because when the mark is read with the beam reflected from the positioning mark, a metal assures a higher reflectivity and it may be easily read by the camera. Moreover, in the case where the positioning mark is read with the transmitting light beam, since the metal does not transmit the light beam, the positioning mark can be recognized by a silhouette and can easily be read by the camera.

Moreover, it is also desirable that the positioning mark is formed simultaneously with a conductive circuit, because it is not required, in this case, to additionally provide the process to form the positioning mark.

Specifically, at the time of forming a conductor pattern by etching a copper clad laminated plate, the positioning marks may be formed. Moreover, a plating resist is provided at the conductor circuit and the positioning mark non-forming area and thereby the conductive circuit and the positioning mark can be formed simultaneously by the plating.

As explained above, when the conductor circuit and positioning mark are formed simultaneously, it is desirable to use an inter layer resin insulator having a light transmissivity because the positioning mark is covered with the interlayer resin insulator.

The inventors of the present invention have made efforts to investigation to find a cause of increase in diameter of the via holes, etc. As a result, it has been proved that when the $CO_2$ laser has the wavelength as long as 10.6 μm, the spot diameter becomes large when the light is focused due to the influence of diffraction of laser beam and when an output is increased, the hole diameter becomes larger than the preset value.

Therefore, it has also been found that diffraction of laser beam can be control led and the spot diameter when the light beam is focused can be set as small as possible to form the via hole having the small diameter when the laser beam has a longer wavelength.

The present invention has been proposed based on such finding and thereby the apparatus for manufacturing the multilayer printed wiring board described in claim 5 discloses a multilayer printed wiring board manufacturing apparatus. comprising a $CO_2$ laser source, a scanning head for deflecting the direction of the laser beam to the X-Y directions or an X-Y table for displacing the position of the multilayer printed wiring board and is characterized in the technical view point by that the laser beam-oscillated from the $CO_2$ laser source is given the shortened wavelength by a harmonic wave generating means.

Moreover, the multilayer printed wiring board manufacturing apparatus according to another embodiment of the present invention is a multilayer printed wiring board manufacturing apparatus comprising a processing laser source, a harmonic wave generating means for converting the laser beam oscillated from the processing laser source to a shortened wavelength laser beam in the second harmonic wave, a scanning head for deflecting the direction of the laser beam toward the X-Y directions or an X-Y table for displacing the position of the multilayer printed wiring board and is also characterized from the technical view point by that the wavelength of the processing laser source is ranged from 720 nm or less to the shortest wavelength or more of the laser source or from 6000 nm or more to the maximum wavelength or less of the laser source.

Moreover, the multilayer printed wiring board described in claim 7 comprises:

a $CO_2$ laser source, a scanning head for deflecting the direction of laser beam to the X-Y directions, a camera for reading the target mark on the multi layer printed wiring board, an X-Y table for placing the multilayer printed wiring board, an input section for inputting the processing data of the multilayer printed wiring board, a memory section for storing the processing data or the arithmetic operations result and an arithmetic operating section in order to:

input the processing data from the input section to store it to the memory section;

measure, with the camera, the position of the target mark of the multi layer printed wiring board placed on the X-Y table:

generate, in the arithmetic operating section, the data for driving the scanning head and the X-Y table from the measured position and the input processing data and then store this data to the memory section;

read, in the control section, the drive data from the memory section and radiate the laser beam to the multilayer printed wiring board by controlling the X-Y table and the scanning head to eliminate the interlayer resin layer in order to form the hole; and is also characterized in the technical view point by that the laser beam oscillated from the $CO_2$ laser source is converted to the shortened wavelength beam in the second harmonic wavelength by the harmonic wave generating means.

Moreover, the multilayer printed wiring board manufacturing method according to one embodiment of the present invention is a multilayer printed wiring board manufacturing method using a manufacturing apparatus comprising a $CO_2$ laser source, a harmonic wave generator for converting the laser beam from the $CO_2$ laser source to the shortened wavelength in second harmonic wave, a scanning head for deflecting the direction of laser beam to the X-Y direction, a camera for reading the target mark of the multilayer printed wiring board and an X-Y table for placing the multilayer printed wiring board and is characterized in the technical view point in comprising the steps of:

measuring the position of the target mark of the multilayer printed wiring board having the interlayer resin insulator placed on the X-Y table;

generating the data for driving the scanning head and the X-Y table from the measured position and the processing data: and eliminating the interlayer resin layer and forming holes by controlling the Y-Y table and the scanning head based on the drive data and radiating the shortened wavelength laser beam in the second harmonic wave from the harmonic wave generator to the multilayer printed wiring board.

The present invention converts the laser beam from the laser source to the shortened wavelength wave by the harmonic wave generating means to control the diffraction of laser beam and also can reduce the spot diameter of laser beam, when the laser beam is focused, by making small the limit value of the focusing limit. As a result, when an output of the laser beam is raised to form a deeper hole, the hole diameter is not widened. Therefore, the via hole and small diameter hole can also be formed.

As the laser source explained above, the $CO_2$ gas is desirable because the apparatus is low price and provides an high output and assures also a lower running cost.

As the harmonic wave generating means, a waveguide or a bulk of non-linear optical crystal may be used.

Specifically, a means for reflecting the laser beam from the $CO_2$ laser source and for transmitting the harmonic generated by non-linear optical crystal is provided in the harmonic wave output side of the non-linear optical crystal. The laser beam of the light source wavelength is reflected and the shortened wavelength laser beam is transmitted in direct. Thereby, the processing is executed only by the shortened wavelength laser beam.

As the means for reflecting the laser beam from the processing laser source and transmitting the harmonic generated by the non-linear optical crystal, a thin film (coating), for example, of sodium fluoride is formed on the surface of collimator lens.

Here, it is recommended to provide the function for totally transmitting the laser beam from the processing laser source on the incident side of the non-linear optical crystal, namely in the processing laser source side for the purpose of improving the input and output efficiency of light beam.

On the incident side of the non-linear optical crystal, the thin film of sodium fluoride and silicon, etc. in which the number of layers and thickness are adjusted is formed at the surface of the condenser lens and the end face of the non-linear optical crystal as the means for giving the function to totally transmit the laser beam from the processing laser source.

Moreover, it is also allowed that the non-linear optical crystal is provided within the laser source and the function for reflecting a part of the laser beam of the light source wavelength is provided on the incident side of the non-linear optical crystal or a resonator is formed within the processing laser source using a half-mirror. It is because the resonator type harmonic wave generator assures high conversion efficiency and also practical use and moreover higher conversion efficiency can also be obtained by giving a higher output to non-linear optical crystal.

As the non-linear optical crystal, tellurium is preferable. The $CO_2$ laser which is optimum as the laser source assures the far infrared band and realizes the phase matching of the wavelength of this band.

When tellurium is used, the cutting angle for the c-axis is determined to $\theta=14.3°$ in order to realize the phase matching for the $CO_2$ laser.

Wavelength of the $CO_2$ laser is 10.6 μm and the second harmonic generated has the wavelength of 5.3 μm. Therefore, the hole in diameter of 50 μm which is about 10 time the second harmonic can easily be formed.

Here, in order to bore the hole on the interlayer resin insulator, wavelength must be 360 nm or less or 3000 nm or more. Therefore, the wavelength of the processing laser source assuring shortened wavelength of the second harmonic wave must be 720 nm or less or 6000 nm or more.

The present invention is particularly effective to form the hole where the aspect ratio (depth of hole/diameter of hole) is 1.5 or less.

In order to attain the object explained above, the multilayer printed wiring board manufacturing apparatus according to yet another embodiment of the present invention is characterized in the technical viewpoint by that:

it is used for processing the multilayer printed wiring board having the interlayer resin insulator;

it comprises a processing laser source, a scanning head for deflecting the direction of laser beam to the X-Y directions, a camera for reading the positioning mark of the multilayer printed wiring board, an X-Y table for placing the multilayer printed wiring board, an input section for inputting the processing data of the multilayer printed wiring board, a memory section for storing the processing data or the arithmetic operations result and an arithmetic operating section; and the X-Y table is provided with the embedded light source at the area corresponding to the positioning mark of the multilayer printed wiring board.

Moreover, the multilayer printed wiring board manufacturing apparatus according to another embodiment of the present invention is characterized in the technical viewpoint by that:

it is used for processing the multilayer printed wiring board having an interlayer resin insulator;

it comprises a processing laser source, a scanning head for deflecting the direction of the laser beam to the X-Y directions, a camera for reading the positioning mark of the multilayer printed wiring board, an X-Y table for placing the multilayer printed wiring board, an input section for inputting the processing data of the multilayer printed wiring board, a memory section for storing the processing data or the arithmetic operations result and an arithmetic operating section;

the X-Y table is provided with an embedded light source at the area corresponding to the positioning mark of the multilayer printed wiring board;

the processing data is input from the input section and it is then stored in the memory section;

a silhouette, which is formed when the light beam from the light source of the X-Y table is shielded by the positioning mark, is read by the camera and the position of the positioning mark of the multilayer printed wiring board placed on the X-Y table is measured;

the data for driving the scanning head and the X-Y table is generated from the measured position and the input processing data in the arithmetic operating section and this drive data is then stored in the memory section; and the drive data is read from the memory section in the control section to control the X-Y table and the scanning head and the laser beam is then radiated to the multilayer printed wiring-board to eliminate the interlayer resin layer in order to form a hole.

In order to attain the object described above, the multilayer printed wiring board manufacturing method according to another embodiment of the present invention is a multilayer printed wiring board manufacturing method utilizing a manufacturing apparatus comprising a processing laser source, a scanning head for deflecting the direction of laser beam to the X-Y directions, a camera for reading the positioning mark of the multilayer printed wiring board and an X-Y table for placing the multilayer printed wiring board and also providing the light source embedded to the area corresponding to the positioning mark of the multilayer printed wiring board and is characterized in the technical viewpoint by comprising the steps of:

forming the positioning mark and interlayer resin insulator on the multilayer printed wiring board;

inputting the processing data to the manufacturing apparatus;

reading a silhouette, with the camera, which is formed when the light beam from the light source of the X-Y table is shielded by the positioning mark of the multilayer printed wiring board and measuring the position of the positioning mark of the multilayer printed wiring board;

generating the data for driving the scanning head and the X-Y table from the measured position and the input processing data; and radiating the laser beam to the multilayer printed wiring board by controlling the X-Y table and the scanning head on the basis of the drive data to eliminate the interlayer resin layer in view of forming the hole.

The laser processing apparatus according to another embodiment of the present invention is characterized in the technical viewpoint by comprising a processing laser source, a scanning head for deflecting the direction of the laser beam to the X-Y directions, a camera for reading the positioning mark of a work piece to be processed, an X-Y table for placing the work piece to be processed, an input section for inputting the processing data of the work piece to be processed, a memory section for storing the processing data or the arithmetic operations result and an arithmetic operating section and is also characterized in providing a light source at the area of the X-Y table corresponding to the positioning mark of the work piece to be processed.

The inventors of the present invention have completed the present invention, as a result of investigation, by finding that the light beam can be always applied from the lower side of the positioning mark, without any interference of the X-Y table itself or the drive motor, by embedding the light source at the position corresponding to the positioning mark of the X-Y table.

In the present invention, when a work piece to be processed such as a multilayer printed wiring board is placed on the X-Y table, since the light source is embedded to the area corresponding to the position mark of the work piece to be processed such as the multilayer printed wiring board, the positioning mark is recognized as a silhouette because the light from the light source is shielded by the positioning mark of the work piece to be processed such as the multilayer printed wiring board and it is then read by the camera. This silhouette is not influenced by the gloss of a resin layer even when the positioning mark is provided at the lower layer of the resin layer to be eliminated by the laser. Moreover, the since the light source is embedded in the X-Y table itself, the light source is never shielded by the X-Y table or the drive motor, and since the light source moves together with the X-Y table, the light can always be applied from the lower side of the positioning mark and the positioning mark can always be recognized even when the X-Y table moves.

In addition, since it is enough that the light source radiates only the positioning mark area, the light source area and amount of light can be reduced and thereby the substrate is never warped and the work piece such as substrate is never changed in size by the heat from the light source.

Moreover, since the light source area can be reduced, a groove and a hole can be provided to the X-Y table for the purpose of vacuum absorption and the substrate can surely be fixed.

As the light source used in the present invention, an LED (Light Emitting Diode), a laser source, a fluorescent light or a small size bulb may be listed. The LED is most preferable because it is small and light, therefore it does not increase an inertia of the X-Y table, assuredly realizing a small amount of heat generation and high luminance. In addition, it is suitable for mass-production of the printed wiring board because it assures a longer exchange time. As the color of light emitted by this LED, green which may be recognized by CCD as the image pickup element of camera is preferable.

As a structure of the light source, an aperture is provided to the X-Y table and the light source such as LED and a socket to be connected to the light source are embedded in this aperture. The socket is connected to the cable wired at the inside or rear surface of the X-Y table and this cable is then connected to the external power supply.

A rectangular shape is the most preferable for the aperture. The positioning mark is formed for each insulator layer and therefore these are never overlapped with each other. Moreover, the apertures are formed in lateral on a line while the positioning mark of each layer is deviated. Since the aperture is formed in the rectangular shape, the positioning mark of each layer can be radiated simultaneously with the light beam.

In the present invention, since the positioning mark is formed in advance at the predetermined position of the work piece such as multilayer printed wiring board, the position of the work piece such as substrate is measured actually by measuring the position of silhouette of the positioning mark with a camera, the data for driving the galvano-mirror and X-Y table is generated to compensate for deviation of the substrate position from the input processing data and the actually measured value of the substrate position and the galvano-mirror and X-Y table are driven depending on this drive data. Thereby, it is possible to realize the boring of many via holes ranging from several hundreds to several tens of hundred while keeping the higher positional accuracy.

In the present invention, it is preferable that the positioning mark of the multilayer printed wiring board is made of a metal conductor. Since a metal does not transmit the light beam, the positioning mark can be recognized by a silhouette and it can easily be read with the camera.

Moreover, the positioning mark is preferably formed simultaneously with the conductive circuit because it is not required, in this case, to additionally provide the positioning mark forming process.

At the time of forming the positioning mark on the multilayer printed wiring board, it is desirable that the positioning mark of the upper layer is deviated from the positioning mark of the lower layer. Thereby, the silhouette of the positioning mark of the upper layer is never overlapped on the positioning mark of the lower layer.

Specifically, the positioning mark can be formed on the occasion of forming the conductor pattern by etching the copper clad laminated plate. Moreover, a plating resist is provided in advance on the area where the conductive circuit and positioning mark are not provided and thereby the conductive circuit and positioning mark can be formed simultaneously through the plating process.

When the conductive circuit and positioning mark are formed simultaneously, the positioning mark is, covered with the interlayer resin insulator. Therefore it is preferable to use a material having the light transmitting property as the interlayer resin insulator. In addition, it is also preferable to use a material having the light transmitting property for the substrate itself on which the interlayer resin insulator is formed.

In order to attain the object described above, the laser processing apparatus according to another embodiment of the present invention is a laser processing apparatus comprising a processing laser source, a scanning head for deflecting the direction of laser beam to the X-Y directions and an X-Y table for placing the work piece to process the work piece with a laser beam by controlling the X-Y table and the scanning head, characterized in the technical viewpoint by providing at least two or more scanning heads and a beam splitter between the processing laser source and an optical path of the scanning head to supply the laser beam to each scanning head by distributing the laser beam.

Moreover, the multilayer printed wiring board manufacturing apparatus according to another embodiment of the present invention is, in order to attain the object explained above, a multilayer printed wiring board which is used for processing a multilayer printed wiring board having an interlayer resin insulator and comprises a processing laser source, a scanning head for deflecting the direction of laser beam to X-Y directions, a camera for reading the target mark of the multilayer printed wiring board, an X-Y table for placing the multilayer printed wiring board, an input section for inputting the processing data of the multilayer printed wiring board, a memory section for storing the processing data or the arithmetic operations result and an arithmetic operating section to input the processing data from the input section, stores this data to the memory section, measures the position of target mark of the multilayer printed wiring board placed on the X-Y table, generates the data for driving the scanning head and the X-Y table from the measured position and the input processing data and stores this drive data to the memory section in the arithmetic operating section, reads the drive data from the memory section and radiates the laser beam to the multilayer printed wiring board by controlling the X-Y table and the scanning head in the control section to eliminate the interlayer resin layer and form the via hole, and this multilayer printed wiring board manufacturing apparatus is also characterized in the technical viewpoint by providing at least two or more scanning heads and a beam splitter between the processing laser source and an optical path of the scanning heads to supply the laser beam to each scanning head by distributing the laser beam with the beam splitter.

Moreover, the multilayer printed wiring board manufacturing method according to another embodiment of the present invention is a multilayer printed wiring board manufacturing method comprising the steps of:

forming the target mark on the multilayer printed wiring board having the interlayer resin insulator;

placing the multilayer printed wiring board having formed the target mark on the X-Y table of the multilayer printed wiring board manufacturing apparatus comprising a processing laser source, at least two or more scanning heads for deflecting the direction of laser beam to the X-Y directions, a camera for reading the target mark of the multilayer printed wiring board, an X-Y table for placing the multilayer printed wiring board, an input section for inputting the processing data of the multilayer printed wiring board, a memory section for storing the processing data or the arithmetic operations result and an arithmetic operating section and then inputting the processing data to this apparatus;

measuring, in the arithmetic operating section, the position of the target mark of the multilayer printed wiring board with the camera, generating the data for driving the scanning head and the X-Y table from the measured position and the input processing data and storing this drive data in the memory section; and reading the drive data from the memory section in the control section and radiating the laser beam to the multilayer printed wiring board by controlling the X-Y table and the scanning head to eliminate the interlayer resin layer to form the via hole; and this method is characterized in the technical viewpoint by distributing the laser beam with a beam splitter provided between the processing laser source and an optical path of the scanning head to supply the laser beam to two or more scanning heads.

In the laser processing apparatus according to an embodiment of the present invention, the multilayer printed wiring board manufacturing apparatus according to an embodiment of the present invention and the multilayer printed wiring board manufacturing method according to an embodiment of the present invention, since the laser beam is distributed by the beam splitter to supply the beam to a plurality of scanning heads even when only one laser source is provided, the boring velocity can be improved even when the apparatus size is not increased and thereby low cost laser boring can be realized. In addition, in the apparatus according to some of the embodiments of the present invention and in the multilayer printed wiring board manufacturing method according to one embodiment of the present invention, processing and boring can be conducted to only one work piece (multilayer printed wiring board) with two or more scanning heads. In this case, the processing and boring time of the work piece (multilayer printed wiring board) can be shortened and moreover the X-Y table area can be reduced to that of only one work piece (multilayer printed wiring board), thereby not resulting in increase in size of the apparatus as a whole.

In the preferred embodiment of the present invention, when a via hole is not formed with the other scanning head on the occasion of forming a via hole with the laser beam via one scanning head, the other scanning head scans the outside of the processing area of the multilayer printed wiring board with the laser beam. Therefore, it is possible to conduct the processing in different patterns with a plurality of scanning heads.

In the preferred embodiment of the present invention, since a transfer mask is provided between the processing laser source and the beam splitter, the structure can be more simplified than the structure where a plurality of masks are provided.

In the preferred embodiment of the present invention, since the transfer mask is provided between the beam splitter and each scanning head, the distance to the multilayer printed wiring board as the processing object from each transfer mask can be equalized.

DESCRIPTION OF THE PREFERRED EMBODIMENTS

The preferred embodiments of the present invention will be explained below with reference to the accompanying drawings.

Figure 1:
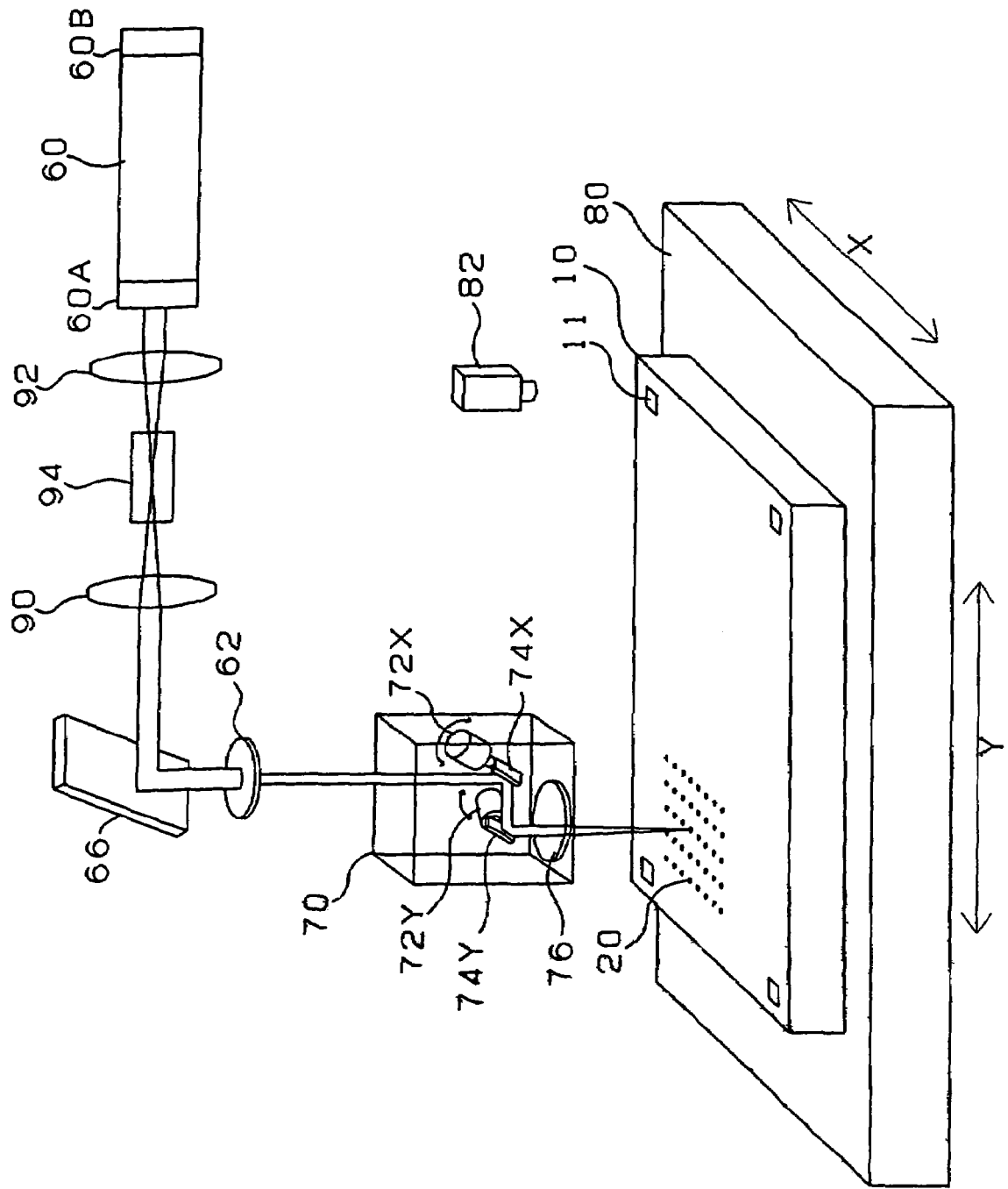
FIG. 1 is a schematic diagram of a multilayer printed wiring board manufacturing apparatus in relation to the first embodiment of the present invention.

FIG. 1 shows a multilayer printed wiring board manufacturing apparatus in relation to the first embodiment of the present invention.

In the first embodiment, as the laser source, a $CO_2$ laser oscillator 60 which generates the $CO_2$ laser in the wavelength of 10.6 µm is used. This $CO_2$ laser oscillator 60 is designed as the resonator type oscillator formed by sealing the $CO_2$ gas between a total reflection mirror 60B and a partial reflection mirror 60A. An energy from the excited $CO_2$ is emitted as the laser beam via the partial reflection mirror 60A.

The laser beam in the beam diameter of 20 mm radiated from the $CO_2$ laser oscillator 60 is condensed by a condenser lens 92 of zinc selenium (ZnSe) coated with a thin film of sodium fluoride (manufactured by MELLES GRIOT) and is then incident to a metal tellurium 94. The surface of the condenser lens 92 is perfectly transmitting the light beam in the wavelength of 10.6 µm (AR: ANTIREFLECTION).

Tellurium 94 has the length of 5 mm and is cut in the angle $\theta=14.3°$ for the c-axis for the phase matching. The incident light in the wavelength of 10.6 µm is converted to the second harmonic wave in the wavelength of 5.3 µm by tellurium. The converted second harmonic wave is emitted from the tellurium crystal 94 and is then incident to the collimator lens 90. The incident and emitting end faces of the tellurium crystal 94 are coated with the thin film of sodium fluoride having the antireflection property for the beam in the wavelength of 10.6 µm in order to improve the incident and emitting efficiency.

The second harmonic wave in the wavelength of 5.3 µm emitted from tellurium 94 is paralleled by the collimator lens 90. The surface of the collimator lens 90 (produced by MELLES GRIOT) is coated with a thin film of sodium fluoride of which the number of layers and thickness are adjusted. This surface totally reflects (HR: Whole Reflection) the laser beam having the wavelength of 10.6 µm and totally transmits (AR) the second harmonic wave having the wavelength of 5.3 µm. Namely, the laser beam having the wavelength of 10.6 µm which is the unconverted light source wavelength is cut. Therefore, only the laser beam in the wavelength of 5.3 µm contributes to the processing.

The laser beam in the wavelength of 5.3 µm is reflected by a mirror 66 of the optical system and is sent to the galvanohead 70 via the transfer mask 62 to make clear the focal point on the substrate.

The galvano-head (scanning head) 70 is composed of a set of the galvano-mirror formed of the galvano-mirror 74X for scanning the laser beam in the X direction and the galvano-mirror 74Y for scanning the beam in the Y direction. These mirrors 74X, 74Y are driven by the control motors 72X, 72Y. The motors 72X, 72Y adjust the angles of the mirrors 74X, 74Y depending on the control command from the computer to be explained later and also transmits the detection signal from the built-in encoder to the computer side.

The scan area of the galvano-mirror is 30×30 mm. Moreover, the positioning velocity of the galvano-mirror is 400 points/sec within the scanning area. The laser-beam is respectively scanned in the X-Y directions through a couple of galvano-mirror 74X, 74Y and passes the f-θ lens 76 and collides with the bonding agent layer of the substrate 10 to be explained later to form the via hole (aperture).

The substrate 10 is placed on the X-Y table 80 moving in the X-Y directions. As explained above, since the scanning area of galvano mirror of each galvano-head 70 is 30 mm×30 mm and the substrate 10 of 500 mm×500 mm is used, the number of step areas of the X-Y table 80 is 289 (17×17). Namely, the processing of the substrate 10 can be completed by repeating the movement of 30 mm in the X direction 17 times and the movement in the Y direction 17 times, respectively.

The manufacturing apparatus explained above is also provided with the CCD camera 82 and therefore the positions of the target marks (positioning marks) 11 arranged at four corners of the substrate 10 are measured to start the processing after compensating for the error.

Figure 2:
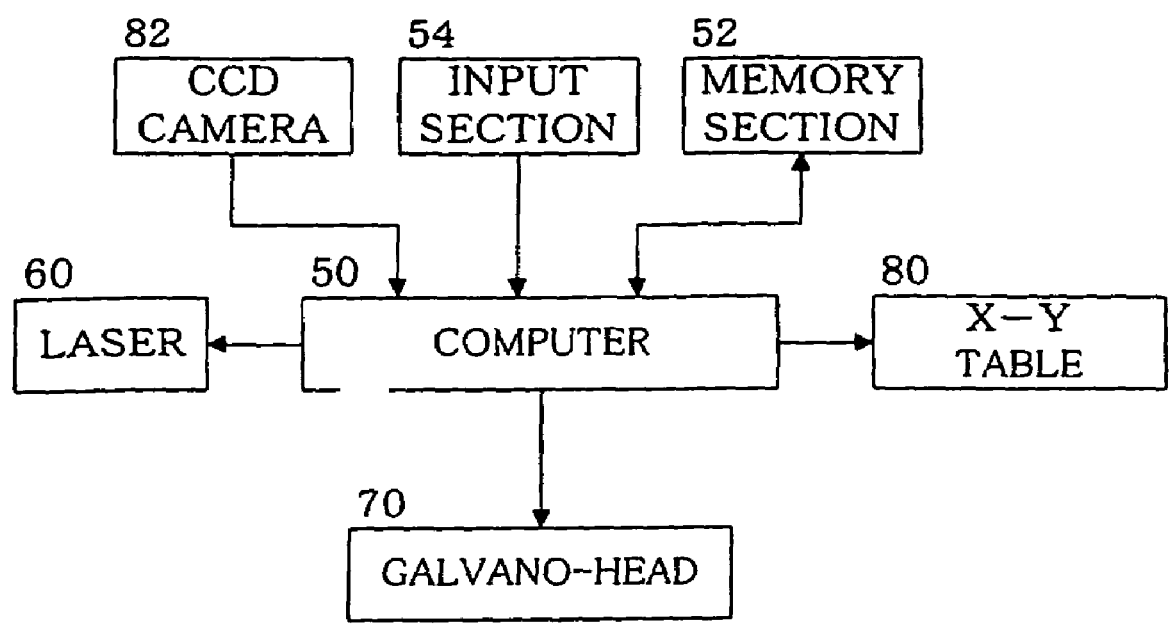
FIG. 2 is a block diagram of a control mechanism of the manufacturing apparatus shown in FIG. 1.

Subsequently, the control mechanism of this manufacturing apparatus will be explained with reference to FIG. 2.

The control apparatus is formed of a computer 50 which receives as an input the hole coordinate data (processing data) of the multilayer printed wiring board input from the input section 54 and the position of the target mark 11 measured by the CCD camera 82 to generate the processing data to be stored in the memory section 52. The actual boring process can be conducted by driving the X-Y table. 80, laser 60 and the galvano-head 70 on the basis of the processing data.

Here, the processing data generating process by the computer 50 will be explained in further detail with reference to FIG. 3.

The computer 50 drives first the X-Y table 80 to the position of the CCD camera 82 to move the target mark 11 (first process). Errors such as deviation in the X direction, deviation in the Y direction, a compression amount of substrate and an amount of rotation are measured by catching the posit ions of the four target marks 11 with the CCD camera 82 (second process). Here, an error data is generated for correcting the error of measurement (third process).

Subsequently, the computer 50 corrects the hole coordinate data consisting of the coordinates of respective holes with the error data generated in the third process to generate the actual processing data consisting of the coordinates of the holes actually bored (fourth process). On the basis of the actual processing data, the galvano-head data for driving the galvano-head 70 is generated (fifth process), the table data for driving the X-Y table is generated (sixth process), and the laser data for the timing of oscillating the laser 60 is also generated (seventh process). This data is temporarily stored in the memory section 52 as explained above and actual boring process is conducted by driving the X-Y table 80, laser 60 and galvano-head 70 depending on this data.

Figure 4:
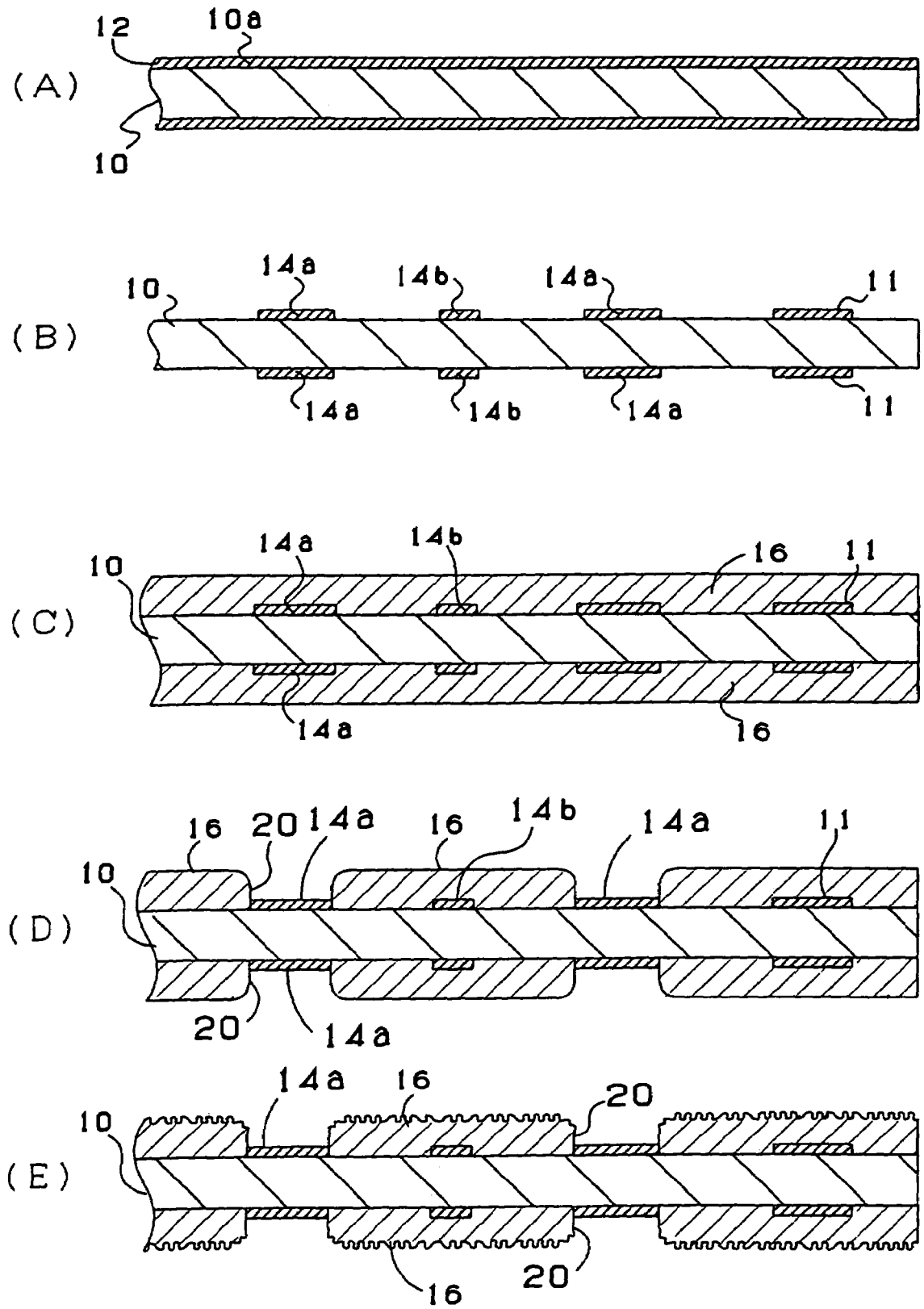
FIG. 4 is a process diagram for manufacturing a multilayer printed wiring board in relation to the first embodiment.

Subsequently, the multilayer printed wiring board manufacturing process using the manufacturing apparatus in relation to the first embodiment of the present invention will be explained with reference to FIG. 4 and FIG. 5.

First, using, as a starting material, a copper clad laminated plate 10a where the copper foil 12 of 18 μm is laminated on both surfaces of the substrate 10 consisting of glass epoxy or BT (bismaleimidetriazine) of 500×500 mm in the thickness of 1 mm shown in FIG. 4(A), the copper foil is etched in the form of a pattern by the ordinary method as shown in the process (B) to form the internal layer copper patterns 14a, 14b and target marks 11 on both surfaces of the substrate 10.

Here, an interlayer resin insulator is prepared. After mixing the cresol novolak type epoxy resin (manufactured by Nippon Kayaku, Co. Ltd. : molecular weight 2500) of 70 parts by weight dissolved into DMDG (dimethylglicoldimethyethel), polyethelsulfone (FE) of 30 parts by weight, imidazole hardening agent (Shikoku Chemicals Corp.: Bland name 2E4MZ-CN) of 4 parts by weight and then further mixing, with this mixture, the epoxy resin particle in average particle size of 5.5 μm of 35 parts by weight and that in average particle size of 0.5 μm of 5 parts by weight these are further kneaded while adding NMP to adjust the viscosity to 12 pa. s with a homogenizer and subsequently these are kneaded with three rolls to obtain the solvent of bonding agent (interlayer resin insulator).

The substrate 10 shown in the process (B) is washed with water and is then dried up. Thereafter, the substrate 10 is subjected to degreasing under the acidic condition, soft-etching, processing with a catalyst solvent including palladium chloride and organic acid to obtain Pd catalyst, activation and the plating in the non-electrolytic plating bath to form the recessed and projected layers (rough surface) of Ni—P—Cu alloy in the thickness of 2.5 μm at the surface of the copper conductive bodies 14a, 14b, target mark 11 and a via hole pad.

Thereafter, the substrate 10 is washed with water is then soaked into the non-electrolytic tin plating bath consisting of tin fluoride boron-thioharnstoff acid solution in the temperature of 50° for an hour to form a tin replacement plating layer in the thickness of 0.3 μm at the surface of the Ni—Cu—P alloy rough surface.

As shown in the process of FIG. 4(C), the bonding agent is coated on the substrate 10 using a roll coater, it is then left for 20 minutes under the horizontal condition. Then, the substrate is dried up for 30 minutes at the temperature of 60° C. to form a bonding agent layer 16 in the thickness of 50 μm. Thereafter, it is then heated at the temperature of 170° C. for five hours to harden the bonding agent layer 16. This bonding agent layer 16 has light transmitting property. Thereby, the target mark 11 covered with the bonding agent layer 16 can be recognized easily with the CCD camera 82.

Thereafter, the substrate 10 is placed on the X-Y table 80 shown in FIG. 1 and the target mark 11 formed on the substrate 10 as explained above is measured with the CCD camera 82. Thereby, after measuring and correcting the deviation of the substrate 10, the pulse beam is applied to the substrate from the laser oscillator 60 to form the hole 20 for via hole to the bonding agent layer 16 on the substrate (refer to process (D)).

Namely, the boring process is conducted with the structure of this embodiment having formed the optical system using a condenser lens 92, a collimator lens 94 and tellurium 94 as the non-linear optical crystal.

An output from the $CO_2$ laser oscillator 60 is 5000 W and pulse time is 1 μsec. A harmonic wave output has the peak level of 1600 W and the conversion efficiency has been 32%. Here, radiation energy has been set to 0.8 mJ.

In this embodiment, the second harmonic wave laser beam of 5.3 μm is radiated through the bonding agent layer (interlayer resin insulator) 16 in the thickness of 50 μm to expose the bottom section (internal layer copper patterns 14a, 14b) in order to form the hole 20 in the depth of 50 μm. Moreover, a small via hole having the upper diameter of hole 20 (aperture diameter) of 40 μm can be obtained.

As explained above, a fine and deep hole can be bored by utilizing the laser beam wavelength of 5.3 μm which has been obtained by modulating the laser beam of the low cost $CO_2$ laser source to the shortened wavelength.

Explained here is the result of testing in formation of the via hole bored to the bonding agent layer 16 of 50 μm by radiating the laser beam under the setting that diameter of mask 62 is 0.6 mm and radiation energy is 0.4 mJ by structuring an optical system, for the purpose of comparison without use of the condenser lens, collimator lens or tellurium. In this case, an output from the $CO_2$ laser is, 5000 W and pulse time is 1 μsec. An output of harmonic wave has the peak level of 1600 W and wavelength is 10.6 μm.

The upper diameter of the hole formed for the testing is 40 μm, the depth of hole is 30 μm and it is impossible to expose the bottom section (internal layer copper patterns 14a, 14b) passing through the bonding agent layer 16 of 50 μm.

When the radiation energy is increased up to 0.8 mJ in the same optical system, it has been realized to expose the bottom section passing through the bonding agent layer 16 in the thickness of 50 μm, but the upper diameter of hole is 60 μm and the diameter of aperture is extended.

As explained above, when the wavelength is 10.6 μm, a hole can be bored through the bonding agent layer by increasing the output, but the hole diameter is also extended. Moreover, when the output is reduced, the hole diameter can be reduced but the laser output cannot be transmitted through the bonding agent layer and the upper layer cannot be connected to the lower layer.

In this embodiment, since the target mark 11 is formed of copper, it assures high reflectivity and can be read easily by the CCD camera 82. Moreover, since copper does not allow transmission of light beam, the positioning mark can be recognized with a silhouette and can be read easily with the CCD camera 82. In this embodiment, copper is used for target mark 11, but other various kinds of metal conductors which also assure higher reflectivity and do not allow transmission of light beam can be used in place of copper.

Moreover, since the target mark 11 is formed simultaneously with the conductive circuit (internal layer copper patterns 14a, 14b), it is not required to additionally provide the target mark forming process.

Subsequently, a multilayer printed wiring board manufacturing method will be explained. In this embodiment, 5000 holes are bored at random on the substrate (500 mm×500 mm) with the shortened wavelength laser beam. Here, as explained above, the scanning area of the galvano-mirror is 30×30 mm and the positioning velocity is 400 points/sec in the scanning area. On the other hand, the number of step areas of the X-Y table is 298 (17×17). Namely, the laser process is completed by repeating the movement of 30 mm in the X direction 17 times and the movement of 30 mm in the Y direction 17 times. The moving velocity of the X-Y table 80 is 15000 mm/min. Meanwhile, the recognizing time of the four target marks 11 by the CCD camera 82 is 9 seconds including the moving time of the table 80. When the substrate 10 is processed by such manufacturing apparatus, the processing time has been 269.5 seconds.

The substrate 10 having formed the holes 20 is soaked into chromium acid for one minute to dissolve the epoxy resin particles in the inter-resin layer insulator in order to obtain rough surface of the inter-resin layer insulator 16 shown in the process (E). Thereafter, the substrate is soaked into the neutralizing solution (manufactured by SHIPLEY Corp.) and is then washed with water.

The substrate 10 having conducted the rough surface forming process is given the palladium catalyst (ATOTECH Corp.) to give the catalyst core to the bonding agent layer 16 and the hole for via hole 20.

Here, liquid resist is prepared. Oligomer given the photo-sensitivity (molecular weight of 4000) obtained by acrylic process for the epoxy group of 25% of the cresol novolac type epoxy resin (produced by Nippon Kayaku Co., Ltd.: Bland name E0CN-103S) dissolved into DMDG, an imidazole hardening agent (manufactured by Shikoku Chemicals Corp.: Bland name 2PMHZ-PW), acrylic isocyanate (manufactured by Toagosei Co., Ltd.: Bland name Alonix M215), benzophenone as the photo-starting agent (manufactured by Kanto Chemical Co., Inc.) and Michler's ketone as the photo-sensitivity amplifying agent (manufactured by Kanto Chemical Co., Inc.) are kneaded using NMP in the following composition. Then these are adjusted to the viscosity of 3000 cps with a homodisper stirrer and are then kneaded with three rolls to obtain the liquid resist. Resin composition; photosensitive epoxy/M215/BP/MK/imidazole=100/10/5/0.5/5

Figure 5:
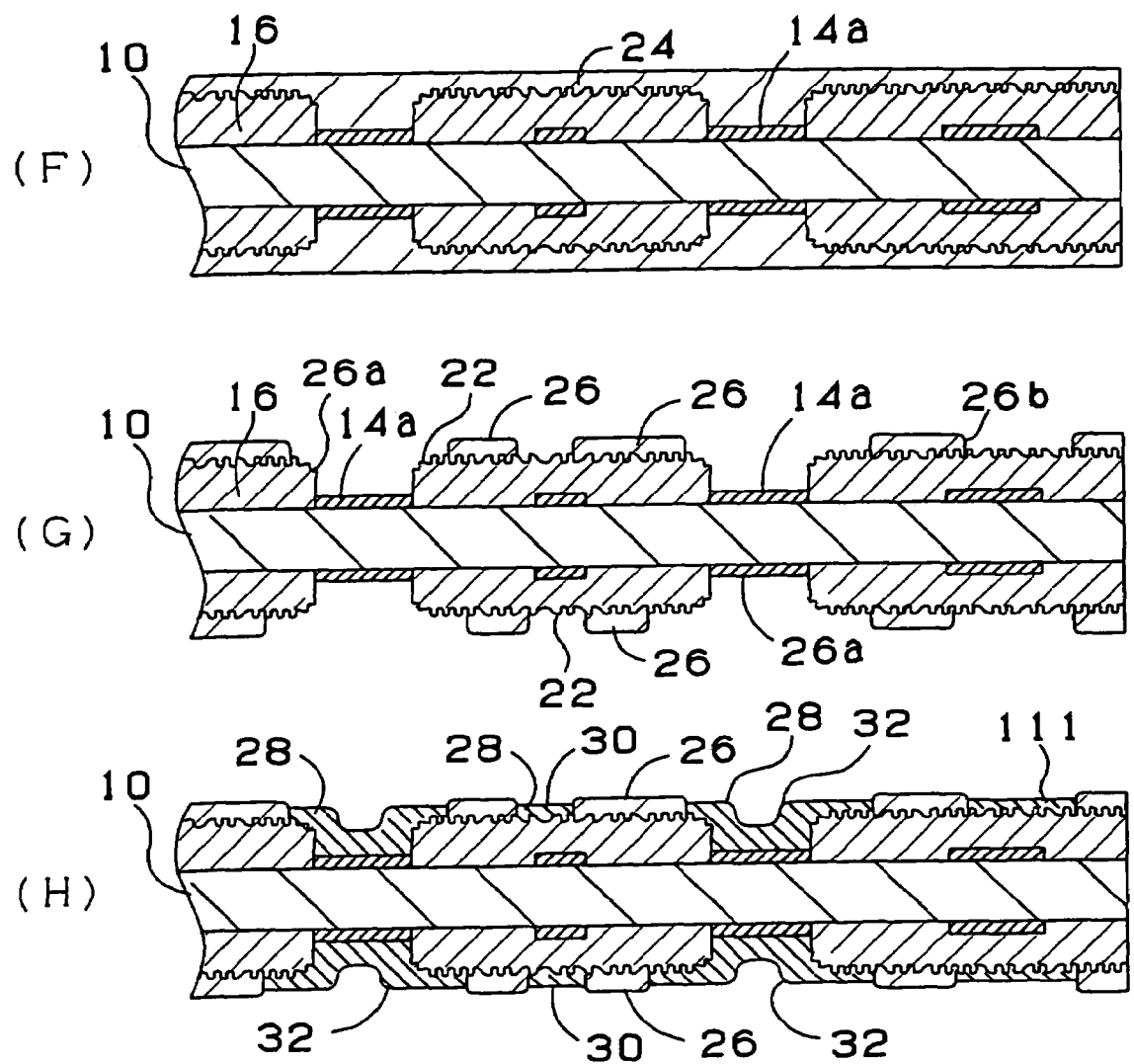
FIG. 5 is a process diagram for manufacturing a multilayer printed wiring board in relation the first embodiment.
Figure 6:
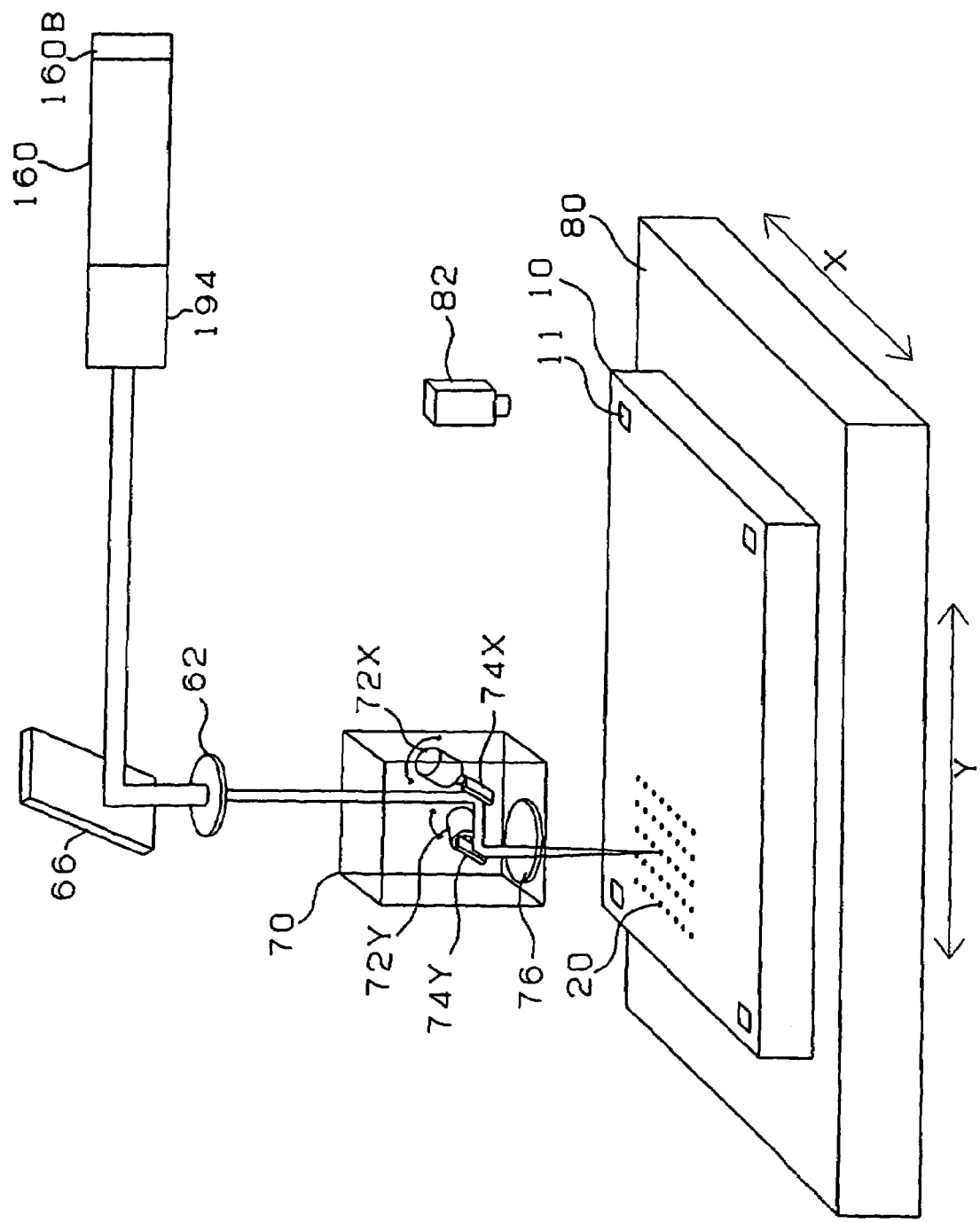
FIG. 6 is a schematic diagram of a multilayer printed wiring board manufacturing apparatus in relation to a modification example of the first embodiment.

As shown in the process (F) of FIG. 5, the liquid resist obtained above is coated to both surfaces of the substrate 10 having completed the process to give the catalyst core using a roll coater. It is then dried up at the temperature of 60° C. for half an hour to form the resist layer 24 in the thickness of 30 μm.

Thereafter, after the non-removing area of the resist layer 24 is exposed by the photo-etching or radiation of small output laser, the resist layer is dissolved by DMTG as shown in the process (G) to form, on the substrate 10, the resist for plating 26 where the pattern 26b to form the conductive circuit pattern 26a and target marks is eliminated. Moreover, the resist is exposed with ultra-high pressure mercury lamp in the energy of 1000 mJ/cm² for an hour at the temperature of 100° C. Thereafter, the substrate is heated for 3 hours at 150° C. to form permanent resist on the interlayer insulator (bonding agent layer) 16.

The substrate 10 having formed the permanent resist 26 as shown in the process (H) is subjected to the pre-plating process (in more concrete, process by sulfuric acid and activation of catalyst core) in advance. Thereafter, the non-electrolytic copper plating 28 in the thickness of about 15 μm is precipitated to the resist non-forming area by the non-electrolytic plating in the non-electrolytic copper plating bath to form the external layer copper pattern 30, via hole 32, and target mark 111. Thereby, a conductive layer is formed by the additive method.

The processes explained above are repeated to further form another conductive layer by the additive method. In this case, an error is measured with the CCD camera 82 using the target mark 111 formed on the interlayer insulator (bonding agent layer) 16 and the hole for via hole is formed by laser. By building up the wiring layers, a multilayer printed wiring board of six layers can be formed.

Subsequently, a structure of the manufacturing apparatus in relation to the modification example of the first embodiment will be explained. In the profile explained above by referring to FIG. 1, tellurium crystal 94 is arranged at the outside of the $CO_2$ laser oscillator 60 formed by sealing the $CO_2$ gas between the anti-reflection mirror 60B and the partial reflection mirror 60A Meanwhile, in the second embodiment, the $CO_2$ laser oscillator 160 is provided, by sealing the $CO_2$ gas, between the tellurium crystal 194 and the anti-reflection mirror 160B. Namely, the tellurium crystal 194 is arranged within the $CO_2$ laser oscillator 160. The tellurium crystal 194 is structured to partially reflect with the surface opposed to the anti-reflect ion mirror 160B to pass only a part of the energy excited by the $CO_2$ gas like the partial reflection mirror 60A in the profile shown in FIG. 1.

In the non-linear type optical crystal such as tellurium crystal, etc., since the conversion efficiency to harmonics is higher when a high output laser beam is incident, a high output laser beam in the $CO_2$ laser oscillator 160 is incident to the tellurium crystal to realize higher efficiency of the conversion to harmonics.

In the embodiment explained above, a galvano-head is used as the scanning head, but a polygon mirror may alternatively be employed. In addition, the laser radiating position can be adjusted by moving the X-Y table without use of the scanning head.

In the above embodiment, the wavelength of $CO_2$ laser is reduced to half by one tellurium crystal, but it is also possible to decrease the laser wavelength to quarter by providing the tellurium crystals in two stages. Moreover, the $CO_2$ laser is used as the laser oscillator, but it is also possible in the present invention to use the harmonics of various laser sources such as argon, etc. Here, the wavelength of laser beam must be 360 nm or less or 3000 nm or more to bore the holes to the interlayer resin insulator. Namely, when the laser beam in the wavelength longer then 360 nm and shorter than 3000 nm is used, heat is not generated when the laser passes the resin. Therefore, when the wavelength is reduced to half, the laser source of the wavelength shorter than 720 nm and longer than 6000 nm must be used. Moreover, when the wavelength is reduced to quarter, the laser source of the wavelength shorter than 1440 nm and longer than 12000 nm must be used.

In addition, in the first embodiment explained above, tellurium is used as the non-linear optical crystal, but various kinds of non-linear optical crystal may be used so long as the phase matching with the laser beam can be attained and such optical crystal allows transmission of the laser beam from 10 μm to 5 μm. For example, gallium-selenium GaSe, antimony sulfide Ag3SBS3, arsenic sulfide Ag3ASS3, mercury sulfide HgS and selenium Se, etc. can be used.

Moreover, as a work piece to be processed, a multilayer printed wiring board is used but the work piece is not limited thereto.

Figure 7:
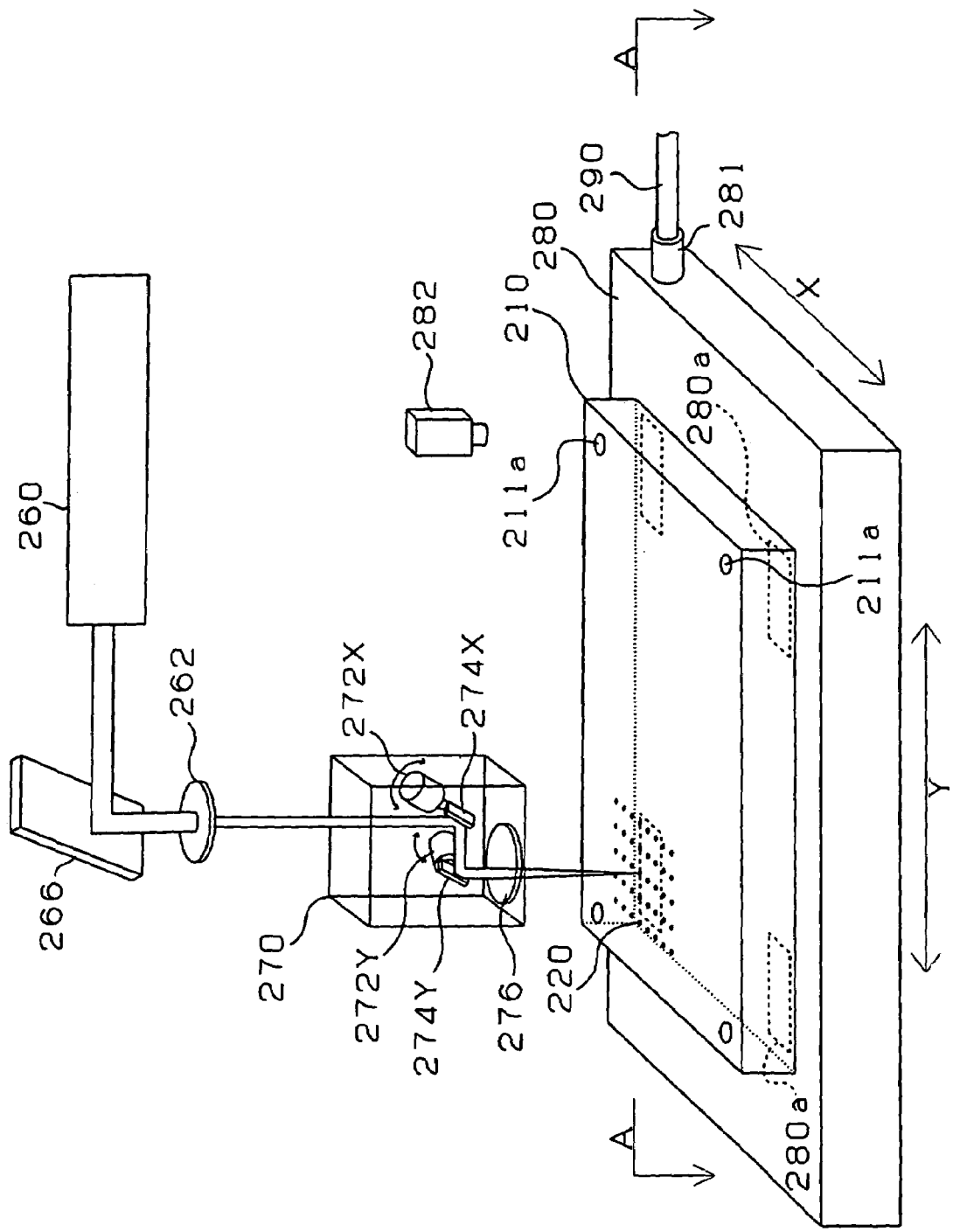
FIG. 7 is a schematic diagram of a multilayer printed wiring board manufacturing apparatus in relation to the second embodiment of the present invention.

The second embodiment of the present invention will be explained with reference to FIG. 7 to FIG. 11. FIG. 7 shows the multilayer printed wiring board manufacturing apparatus in relation to the second embodiment of the present invention.

In the second embodiment, the $CO_2$ laser oscillator 260 in the wavelength of 10.6 μm is used as the laser source. The light beam emitted from the laser oscillator 260 is sent to the galvano-head via the transfer mask 262 in order to make clear the focal point on the substrate.

The scanning head 270 is formed of a galvano-mirror formed of a set of the galvano-mirror 274X for scanning the laser beam in the X direction and the galvano-mirror 274Y for scanning the beam in the Y direction. These mirrors 274X, 274Y are driven by the control motors 272X, 272Y. The motors 272X, 272Y adjust the angles of the mirrors 274X, 274Y according to the control command from the computer to be explained later and also transmit the detecting signal from the built-in encoder to the computer side.

The scanning area of the galvano-mirror is 30×30 mm. Moreover, the positioning speed of galvano-mirror is 400 points/sec in the scanning area. The laser beam is scanned in the X-Y directions via a couple of galvano-mirrors 274X, 274Y to pass the f-θ lens 276 and then reach the bonding agent layer described later of the substrate 210 to form a hole 220 (aperture) for via hole.

The substrate 210 is placed on the X-Y table 280 moving in the X-Y directions. As is explained above, since the scanning area of the galvano-mirror of each galvano-head 270 is 30 mm×30 mm and the substrate 210 of 500 mm×500 mm is used, the step area of the X-Y table 280 is 289 (17×17).

In the manufacturing apparatus, the CCD camera 282 is provided to measure the position of the target marks (positioning marks) 211a arranged at the four corners of the substrate 210 and correct an error in view of starting the processing.

Figure 8:
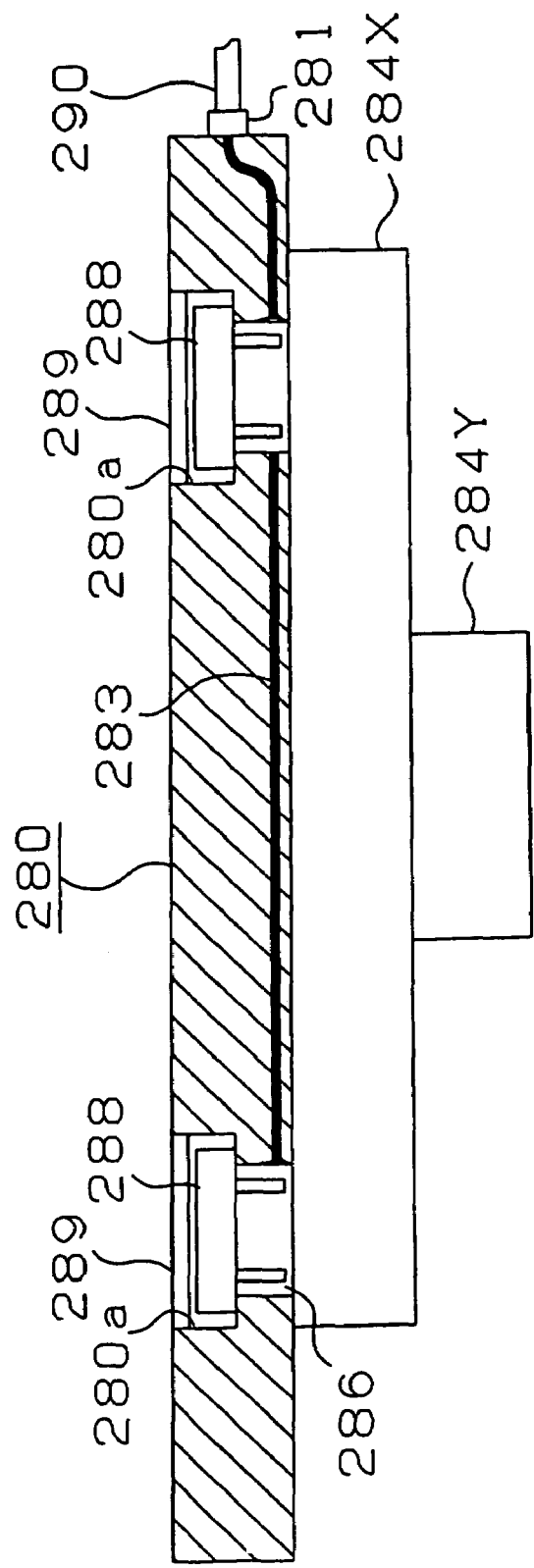
FIG. 8 is a cross-sectional view along the line A-A of the X-Y table shown in FIG. 7.

A structure of the X-Y table 280 of this embodiment will be explained in further detail by referring to FIG. 7 and FIG. 8. FIG. 8 is a cross-sectional view along the line A-A of the X-Y table 280 shown in FIG. 7.

As shown in FIG. 7, a rectangular aperture 280a of 30 mm×8 mm is provided to the area corresponding to the positioning mark 211a of the printed wiring board 210 when the printed wiring board 210 is placed at the four corners of the X-Y table 280. As shown in FIG. 8, a socket 286 is engaged with respective aperture 280a. The socket 286 is connected to the cable 283 wired at the inside of the X-Y table 280 and this cable 283 is connected to the connector 281 provided at the end part of the X-Y table 280. This connector 281 is further connected to the cable 290 from the external power supply. Connection with the external power supply may also be realized through slide contact method, in addition to use of cable of this embodiment. In the socket 286, four LEDs 288 conforming to the specification No. HP-HLMP-2685 (Stanley Electric Co., Ltd. H-3000-L, Sharp Corp. GL5-UR-3K, etc.) are fixed. The aperture 280a is provided with a transparent or semi-transparent glass or acrylic cover 289 and thereby the LED 288 may be protected if the laser beam is erroneously radiated. At the lower side of the X-Y table 280, the X drive motor 284X for driving in the X direction and Y drive motor 284Y for driving in the Y direction are arranged. In the X-Y table 280 of this embodiment, a groove and a hole (not illustrated) are provided for vacuum absorbing and fixing the substrate to the surface other than that corresponding to the light source.

Explanation of the control mechanism of the manufacturing apparatus is not repeated here because it is similar to that of the first embodiment explained above.

Figure 9:
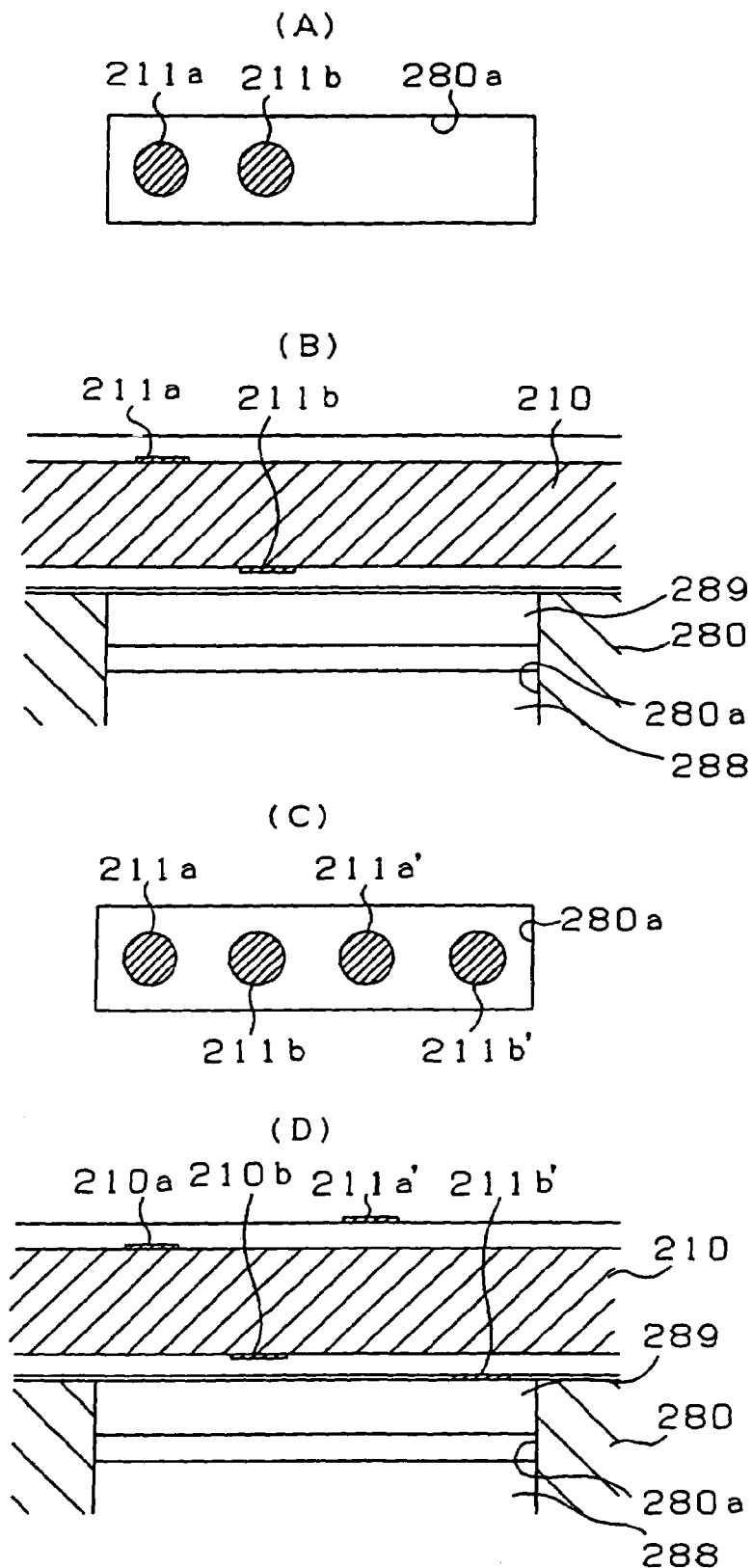
FIG. 9(A) is a plan view of an aperture of the X-Y table shown in FIG. 8.
FIG. 9(B) is a cross-sectional view of the aperture.
FIG. 9(C) is a plan view of the aperture.
FIG. 9(D) is a cross-sectional view of the aperture.

Here, the processing data generating process by the computer 250 of the second embodiment will be explained. The process by the computer 250 is similar to that of the first embodiment described above with reference to FIG. 3 and therefore it will be explained with reference to FIG. 3 and FIG. 9. FIG. 9(B) is an enlarged cross-sectional view of the aperture 280a of the X-Y table 280 shown in FIG. 8. FIG. 9(A) is a plan view of the aperture 280a viewed from the side of the CCD camera 282.

Figure 3:
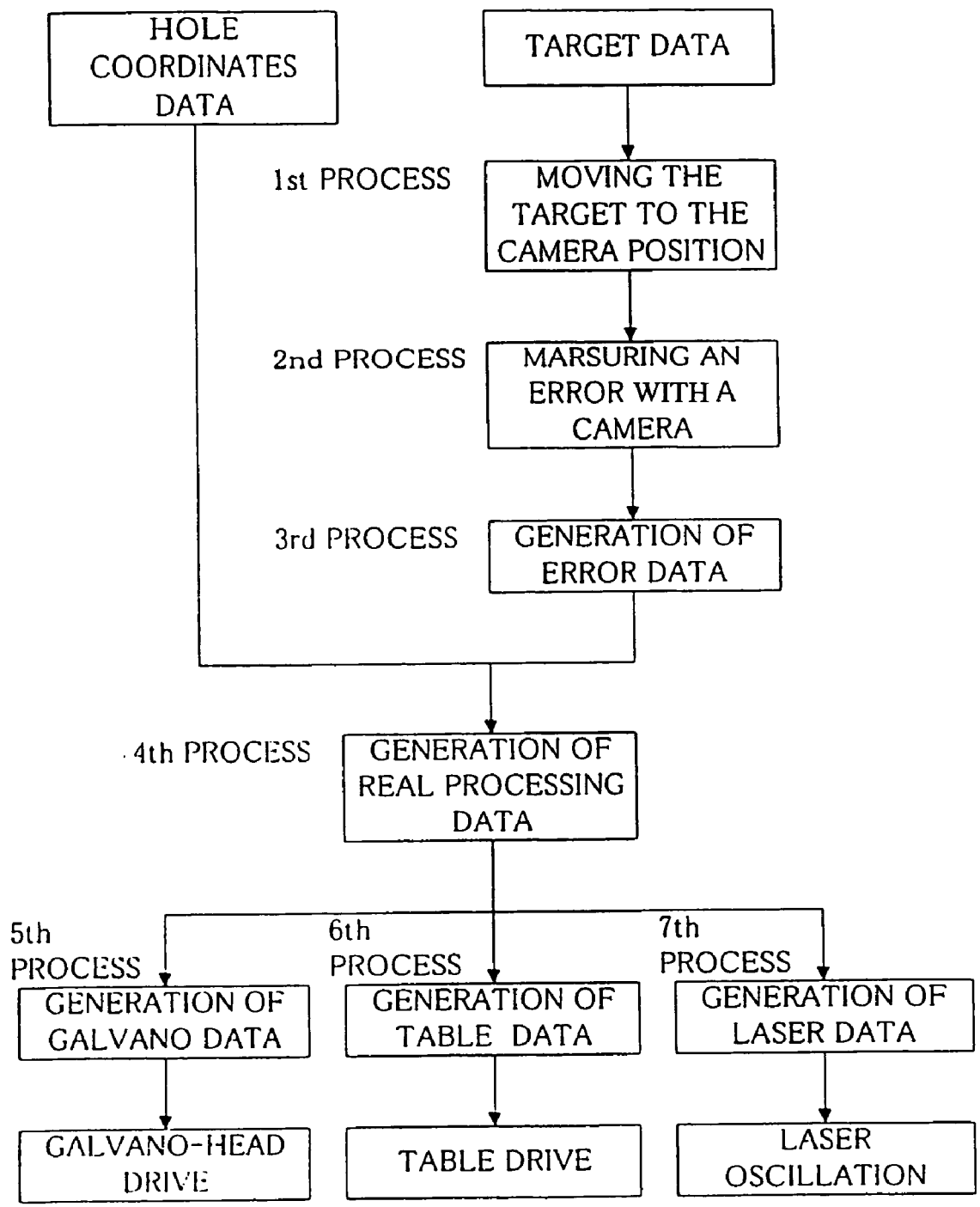
FIG. 3 is a process diagram for the processing conducted by the control mechanism shown in FIG. 2.

The computer 250 first drives the X-Y table 280 to the position of the CCD camera 282 to move the target mask 211a (first process shown in FIG. 3). The LED 288 is caused to emit the light to pass through the BT resin substrate 210 (refer to FIG. 9(B)) to generate silhouettes of the target mark 211a on the substrate surface side and of the target mark 211b of the substrate rear surface side (refer to FIG. 9(A)). The CCD camera 282 recognizes the silhouettes and picks up the positions of the four target marks 211a of the substrate 210 (refer to FIG. 7) to measure the errors such as deviation in the X direction, deviation in the Y direction, compression of substrate, and a rotating amount (second process). In order to correct the errors measured, an error data is generated (third process). The four target marks 211b are picked up to process the rear surface side of the substrate 211. The desirable shape of the target mark is circular shape in which the center point can be extracted easily by the computer.

Subsequently, the computer 250 corrects the hole coordinate data consisting of the coordinates of the processing holes with the error data generated by the third process to generate the actual processing data consisting of the coordinates of the holes to be bored actually (fourth process). On the basis of the actual processing data, the scanning head data for driving the galvano-head 270 is generated (fifth process), the table data for driving the X-Y table 280 is generated (sixth process), and the laser data of the timing for oscillating the laser 260 is generated (seventh process). This data is temporarily stored in the memory section 252 and actual boring process is executed by driving the X-Y table 280, laser 260, and galvano-head 270 based on this data.

Thereafter, the manufacturing process of a multilayer printed wiring board by utilizing the multilayer printed wiring board of the second embodiment of the present invention will be explained with reference to FIG. 10 and FIG. 11.

Figure 10:
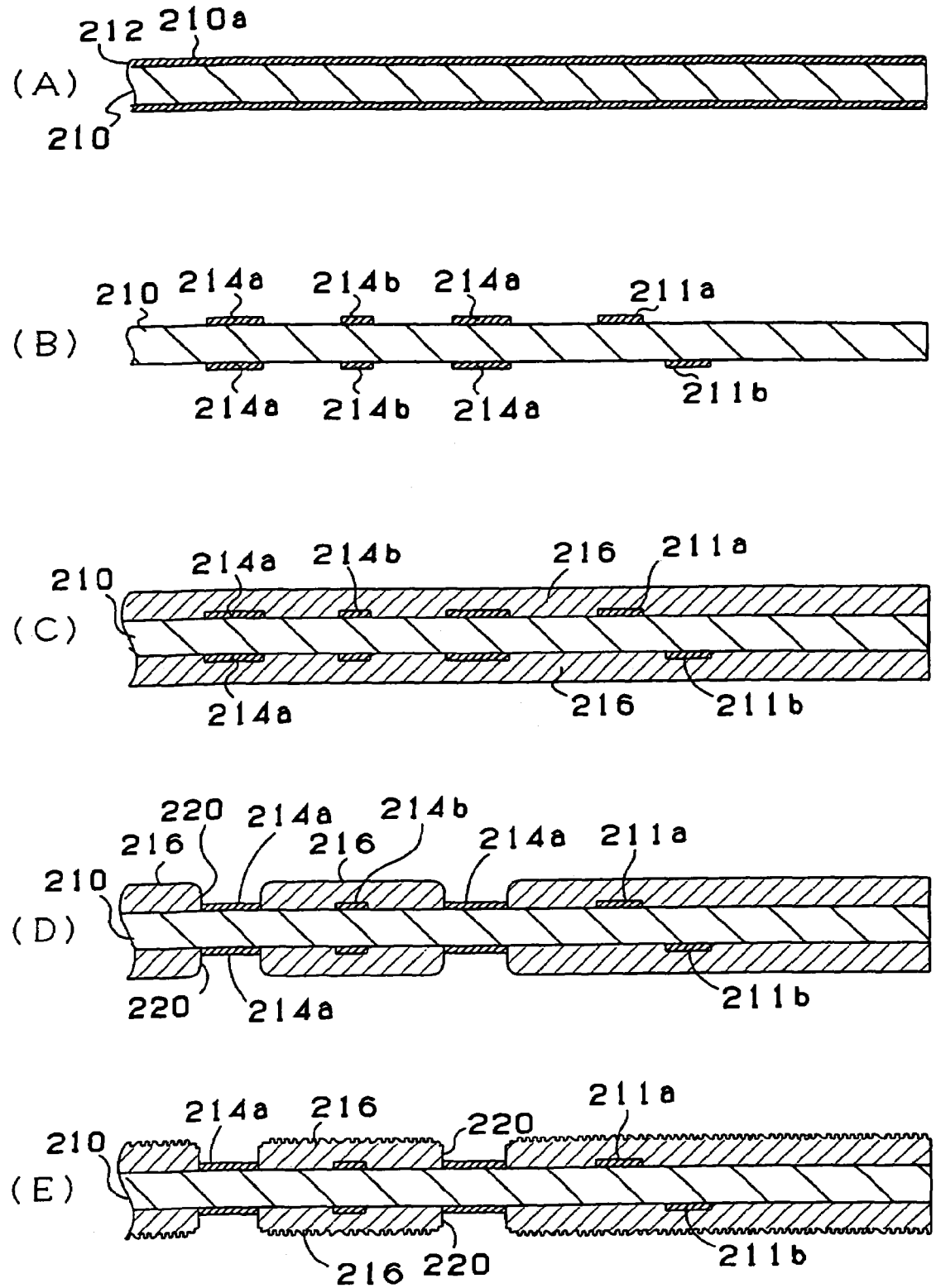
FIG. 10 is a process diagram for manufacturing a multilayer printed wiring board in relation to the second embodiment.

First, using, as the starting material, the copper clad laminated plate 210a in which the copper foil of 18 μm is laminated on both surfaces of the substrate 210 consisting of transparent or semi-transparent glass epoxy or BT (bismaleimidetriazine) of 500×500 mm in the thickness of 1 mm shown in the process (A) of FIG. 10, the internal layer copper patterns 214a, 214b, target mark 211a for processing the substrate surface and target mark 211b for processing the rear surface are formed on both sides of the substrate 211 by etching the copper foil into the pattern by the ordinary method as shown in FIG. 10(B).

The substrate 210 shown in FIG. 10(B) is washed with water and is then dried up. The substrate 210 is then subject to the degreasing process in the acid for the soft etching purpose. It is then processed by the catalyst solvent consisting of palladium chloride and organic acid. Thereby, it is given the Pd catalyst and activated. Thereafter, it is subject to the plating in the non-electrolytic plating bath to form the recessed and projected layer (rough surface) of Ni—P—Cu alloy in the thickness of 2.5 μm on the surface of the copper conductors 214a, 214b, target marks 211a, 211b and via hole pad.

The substrate is then washed with water and is then soaked into the non-electrolytic tin plating bath consisting of tin borofluoride thiourea for an hour at the temperature of 50° C. to form a tin replacement plating layer of 0.3 μm in thickness at the surface of the Ni—Cu—P alloy rough surface.

As shown in the process (C), the bonding agent is coated on the substrate 210 using a roll coater, it is then left for 20 minutes under the horizontal condition. Then, the substrate is dried up for 30 minutes at the temperature of 60° C. to form the bonding agent layer 216 of 50 μm in thickness. Thereafter, the bonding agent layer 216 is hardened by heating process for 5 hours at 170° C. in the heating furnace. This bonding agent layer 216 has a light transmitting property. Thereby, the target marks 211a, 211b covered with this bonding agent layer 216 can be recognized easily with the CCD camera 282.

Thereafter, the substrate 210 is placed on the X-Y table 280 shown in FIG. 7 and the substrate 210 is fixed on the X-Y table 280 by vacuum absorption through the grooves and holes provided on the X-Y table 280. Then, the target marks 211a formed on the four corners of the substrate 210 as mentioned above are measured with the CCD camera 282 and deviation of the substrate 210 is measured and corrected. Thereafter, the pulse beam of 50 μsec is applied in the output of 400 W from the laser oscillator 260. This light beam is used to form a hole 220 for via hole to the bonding agent layer 216 of the substrate (refer to process (D)).

In this embodiment, since copper which does not allow transmission of light beam is used for the target marks 211a, 211b, the positioning mark can be recognized easily and can be read easily with the CCD camera 282 by means of the silhouettes. In this embodiment, copper is used for the target marks 211a, 211b, but the other various metal conductors which also do not allow transmission of light beam can also be used.

Moreover, since the target marks 211a, 211b are formed simultaneously with the conductive circuit (internal layer copper patterns 214a, 214b), it is not required to additionally provide the process to form the target marks.

In this embodiment, 5000 holes are bored at random on the substrate (500 mm×500 mm). Here, as explained above, the scanning area of the galvano-mirror is 30×30 mm and the positioning speed is 400 points/sec within the scanning area. On the other hand, the number of step areas of the X-Y table 280 is 289 (17×17). The moving speed of the X-Y table 280 is 15000 mm/min. Meanwhile, the recognizing time of the four target marks 211a, 211b by the CCD camera 282 is 9 seconds including the moving time of the table 280.

When the substrate 210 is manufactured with this manufacturing apparatus, the processing time is 269.5 seconds.

The substrate 210 having formed the holes 220 is soaked into chromium acid for one minute to dissolve the epoxy resin particles in the inter-resin layer insulating layer to form the layer 216 having the rough surface as shown in the process (E). Thereafter, the substrate is soaked into the neutral solution (SHIPLEY Corp.) and then it is washed with water.

The catalyst core may be given to the bonding agent layer 216 and hole 220 for via hole by giving the palladium catalyst (ATOTECH Corp.) to the substrate 210 with the rough surface forming process completed.

Figure 11:
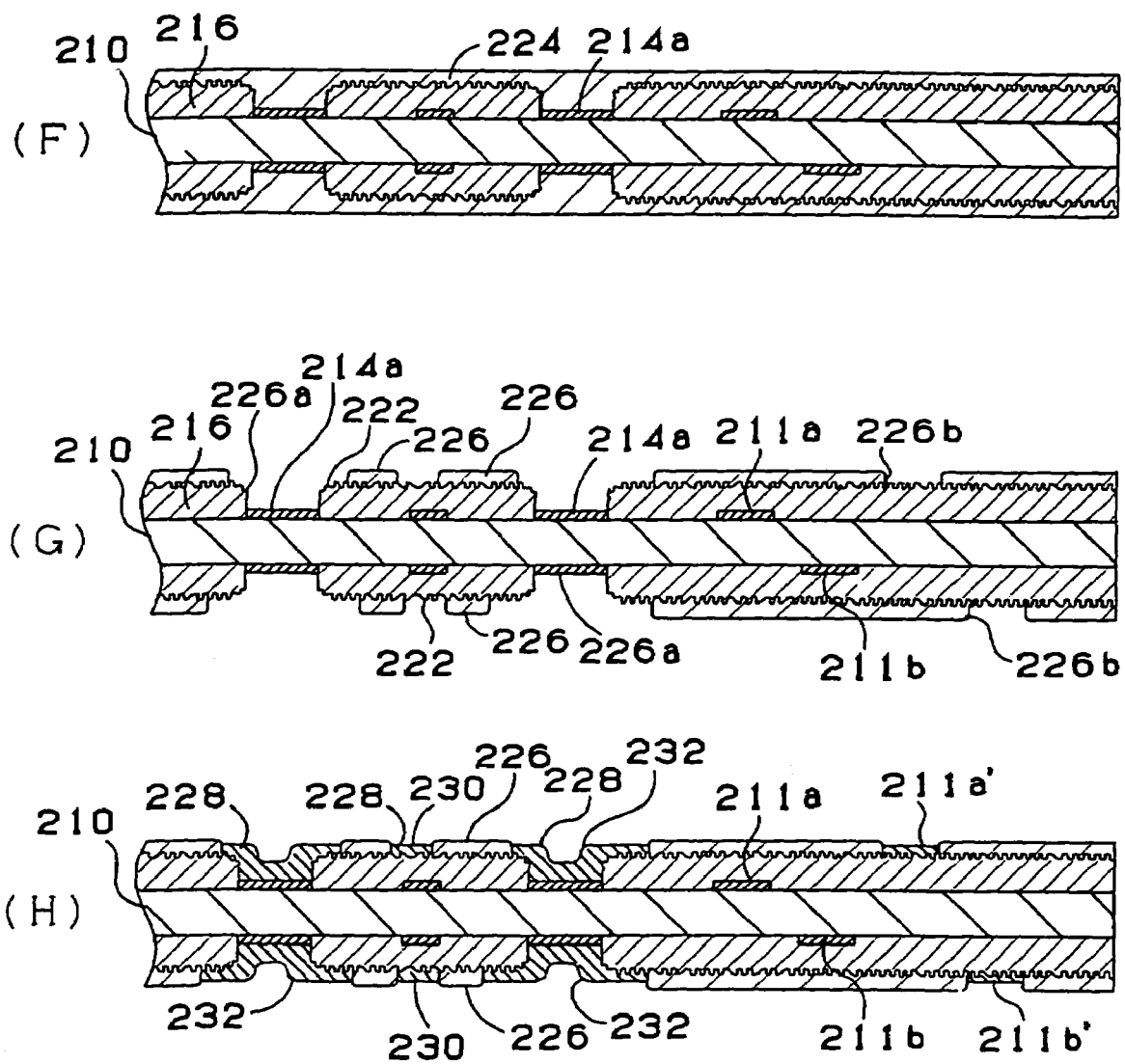
FIG. 11 is a process diagram for manufacturing a multilayer printed wiring board in relation to the second embodiment.

As shown in the process (F) of FIG. 11, the liquid resist like that in the first embodiment is coated with a roll coater on both surfaces of the substrate 21 with the catalyst core giving process completed and it is then dried up for 30 minutes at 60° C. to form the resist layer 224 of 30 μm in thickness.

Thereafter, the non-removing section of the resist layer 224 is exposed by the photoetching or laser radiation of a small output and then the resist layer is dissolved by DMTG as shown in the process (G) to form the resist 226 for the plating on the substrate 210 where the pattern 226b to form the conductive circuit 226a and target marks is eliminated. Then, the substrate is exposed with an ultra-high pressure lamp in the energy of 1000 mJ/cm². Moreover, the substrate 210 is heated for 1 hour at 100° C., then 3 hours at 150° C. to form the permanent resist 226 on the interlayer insulating layer (bonding agent layer) 216.

As shown in the process (H), the pre-processing (specifically, process by sulfuric acid and activation of catalyst core) is executed to the substrate 210 on which the permanent resist 226 is formed. Thereafter, non-electrolyte copper plating 228 in the thickness of 15 μm is precipitated on the resist non-forming section by the non-electrolytic plating in the non-electrolytic copper plating bath to form the external layer copper pattern 230, via hole 232 and target marks 211a', 211b' in view of forming the conductive layer by the additive method.

By repeating the processes explained above, one more conductive layer is formed by the additive method. In this case, as shown in FIG. 9(C) and FIG. 9(D), an error is measured with the CCD camera 282 and the hole for via hole is formed by laser beam by use of the surface processing target marks 211a' and the rear surface processing target mark 211b' formed on the interlayer insulating layer (bonding agent layer) 216. The multilayer printed wiring board of four or more layers can be formed by building up the wiring layers as explained above.

The third embodiment of the present invention will be explained with reference to FIG. 12 to FIG. 17.

Figure 12:
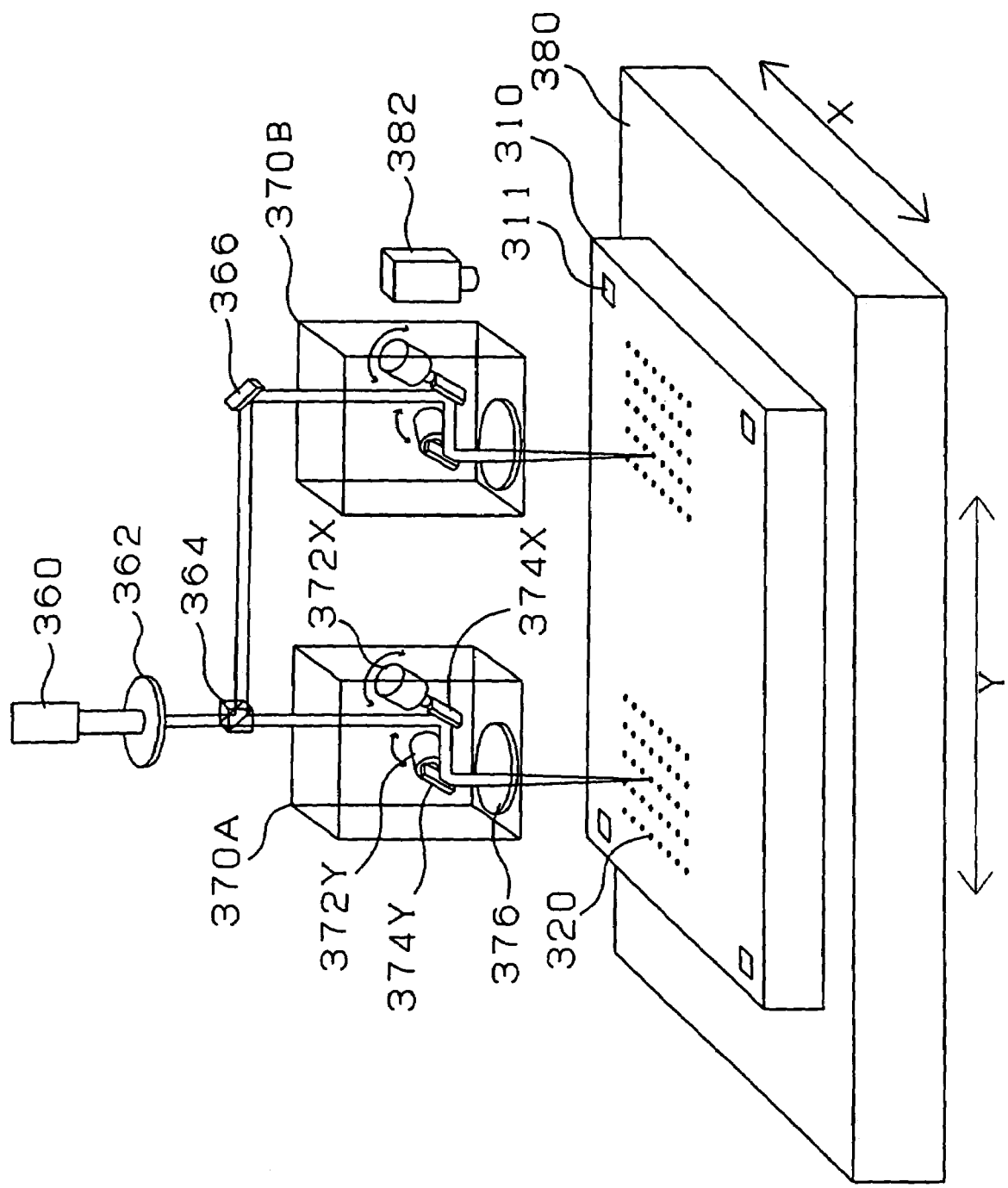
FIG. 12 is a schematic diagram of a multilayer printed wiring board in relation to the third embodiment of the present invent ion.

FIG. 12 shows a multilayer printed wiring board manufacturing apparatus in relation to the third embodiment of the present invention.

In this embodiment, the $CO_2$ laser oscillator 360 is used as the laser source. The light beam emitted from the laser oscillator 360 is incident to a beam splitter 364 via the transfer mask 362 in order to make clear the focal point on the substrate. In the beam splitter 364, the incident light is distributed by 1:1 in the power ratio and is then transmitted to the side A galvano-head (scanning head) 370A and to the side B galvano-head (scanning head) 370B through reflection by the mirror 366. As the beam splitter, those combining a plurality sets of the prisms and those obtained by arranging a multilayer film on zinc-selenium (ZnSe) may be used.

The side A galvano-head 370A and side B galvano-head 370B are respectively formed of a set of galvano-mirrors consisting of the galvano-mirror 374X for scanning the laser beam in the X direction and the galvano-mirror 374Y for scanning the beam in the Y direction, and these mirrors 374X, 374Y are driven by the control motors 372X, 372Y. The motors 372X, 372Y adjust the angles of the mirrors 374X, 374Y and transmit the detecting signal from the built-in encoder to the computer side according to the control command from the computer to be described later.

The scanning area of the galvano-mirror is 30×30 mm and the positioning speed of the galvano-mirror is 400 points/sec in the scanning area. The distance between the side A galvano-head 370A and side B galvano-head 370B is set to 250 mm interval which is a half of the substrate (500 mm×500 mm) for multiple chamfering in order to improve the efficiency of substrate processing. The laser beam is scanned in the X-Y directions via a couple of galvano-mirrors 374X, 374Y and then passes through the f-θ lens 376 and then reaches the bonding agent layer of the substrate 310 to be explained later to form the hole (aperture) for the via hole.

The substrate 310 is placed on the X-Y table 380 moving in the X-Y directions. As explained above, since the scanning area of the galvano-mirrors of the galvano-heads 370A, 370B is 30 mm'30 mm and the substrate 31 of 500 mm×500 m is used, the number of step areas of the X-Y table 380 is 289 (17×17). Namely, the laser processing is completed by repeating the movement of 30 mm in the X direction 17 times and the movement of 30 mm in the Y direction 17 times.

In the manufacturing apparatus, the CCD camera 382 is arranged and the processing is started after measuring the positions of the target marks 311 arranged at the four corners of the substrate 310 and then compensating for an error.

Figure 13:
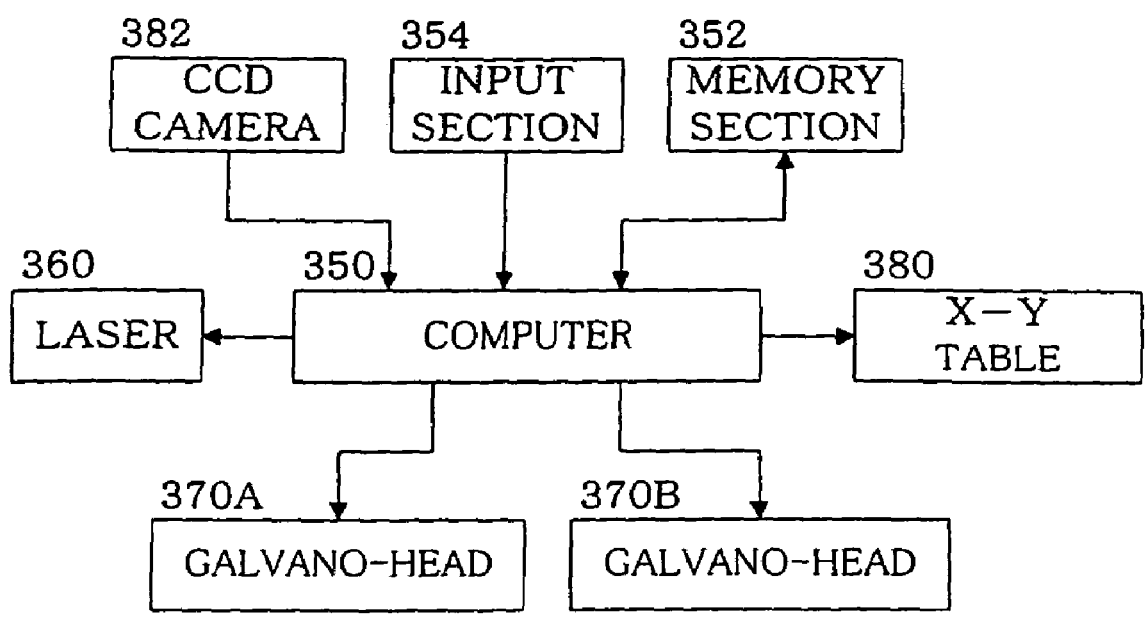
FIG. 13 is a block diagram of a control mechanism of the manufacturing apparatus shown in FIG. 12.

Subsequently, the control mechanism of the manufacturing apparatus will be explained with reference to FIG. 13.

The control apparatus is composed of a computer 350 which receives an input the hole coordinate data of the multilayer printed wiring board (processing data) input from the input section 354 and the position of the target marks (positioning marks) 311 measured by the CCD camera 382 to generate the processing data and then stores it to the memory section 352. On the basis of the processing data, the X-Y table 380, laser 360 and galvano-heads 370A, 370B are driven for the purpose of actual hole boring process.

Figure 14:
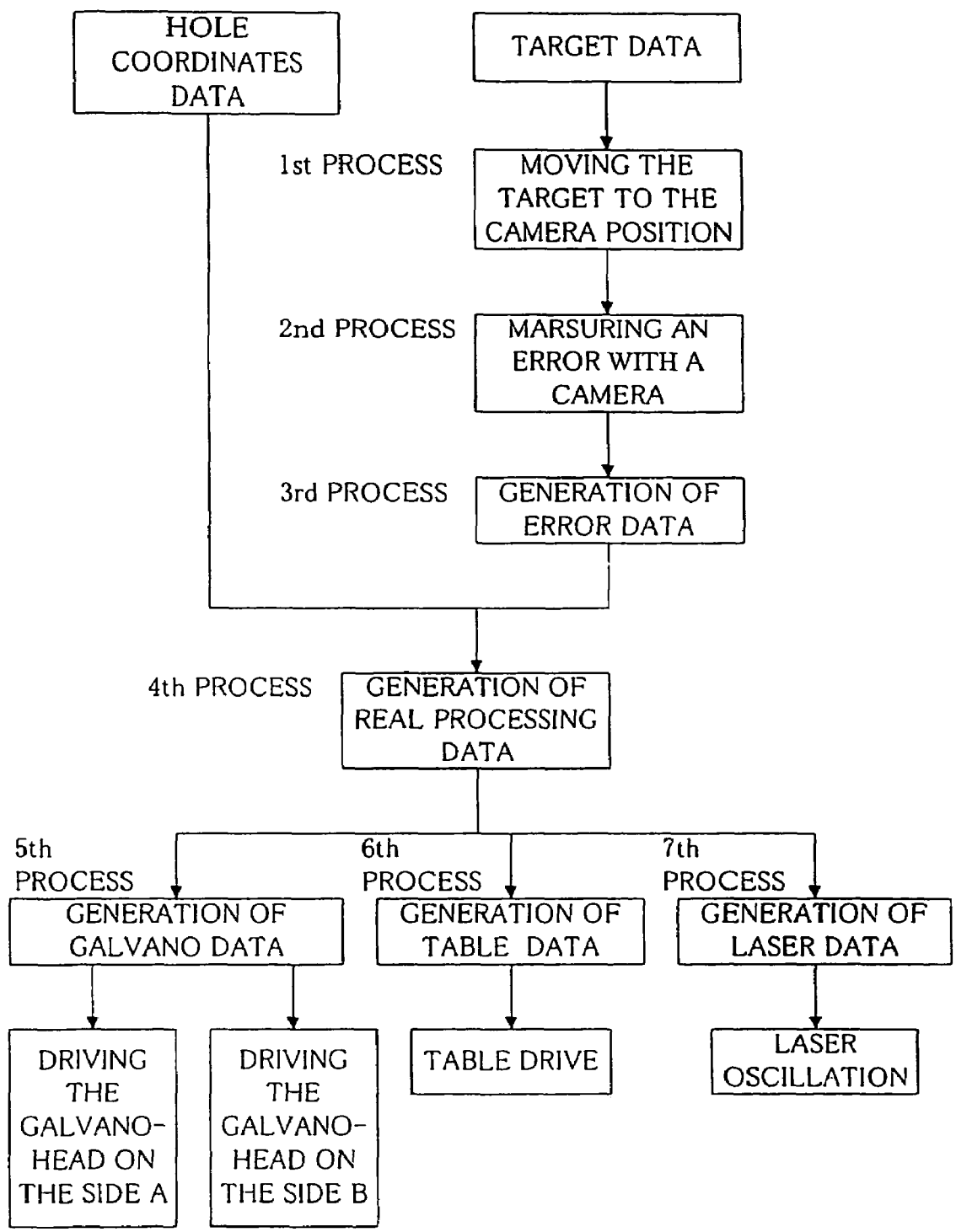
FIG. 14 is a process diagram of the processing by the control mechanism shown in FIG. 13.

Here, the processing data generating process by the computer 350 will be explained in detail with reference to FIG. 14.

The computer 350 drives the X-Y table 380 to the position of the CCD camera 382 to move the target mark 311 (first process). Errors such as deviation in the X direction, deviation in the Y direction, compression of substrate, and an amount of rotation can be measured by picking up the positions of the four target marks 311 with the CCD camera 382 (second process). The error data for compensating for the measured error is generated (third process).

Thereafter, the computer 350 corrects the hole coordinate data consisting of the coordinates for hole boring with the error data generated by the third process to generate the actual processing data consisting of the coordinates of the hole to be bored actually (fourth process). On the basis of the actual processing data, the galvano-head data for driving the galvano-heads 370A, 370B is generated (fifth process), the table data for driving the X-Y table 380 is generated (sixth process), and the laser data of the timing for oscillating the laser 360 is also generated (seventh process). This data thus generated is then stored temporarily in the memory section 352 and drives the X-Y table 380, laser 360 and galvano-heads 370A, 370B on the basis of the data for the purpose of actual hole boring process.

Figure 15:
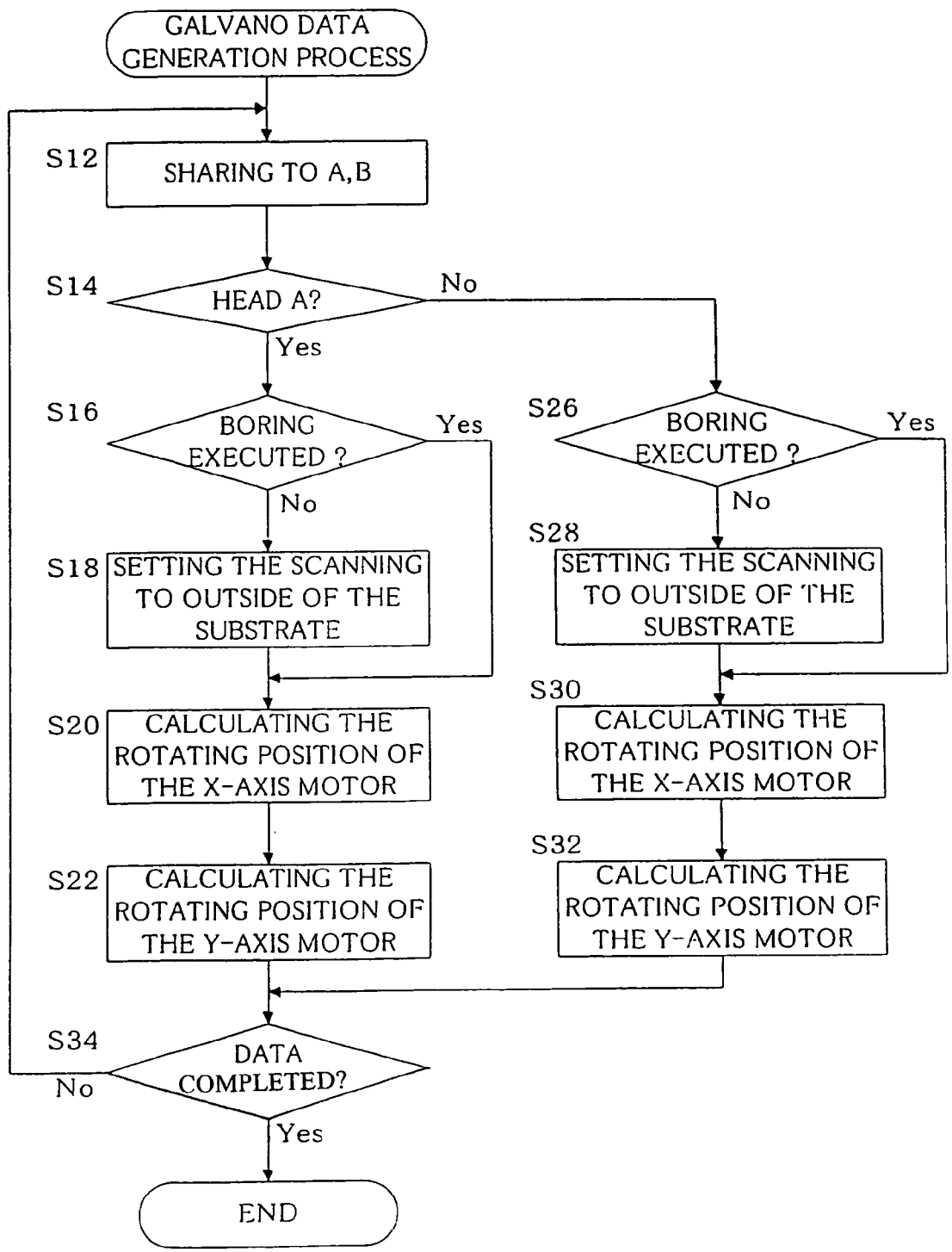
FIG. 15 is a flowchart of the galvano data generating process shown in FIG. 14.

Generation of the galvano-data used in the fifth process will be explained in more detail with reference to FIG. 15 showing the flowchart of this process.

At the time of manufacturing a plurality of multilayer printed wiring boards by multiple chamfering of the substrate, it may be thought reasonable to conduct the hole boring process with the same pattern in order to simultaneously bore the holes of two sheets of the multilayer printed wiring board in the same shape with the side A galvano-head 370A and side B galvano-head 370B. However, since the positional accuracy of the hole boring process is 20 μm, it is required to position the adjacent two multilayer printed wiring boards of the same shape to the accuracy of 20 μm but it is very difficult. Therefore, in this embodiment, the holes are bored on the side A galvano-head 370A differently from those on the side B galvano-head 370B. The process for this purpose is conducted by the process shown in FIG. 15 to be explained later.

First, the computer 350 determines, from the coordinates of each hole of the actual processing-data, whether each hole should be processed by the side A galvano-head 370A or side B galvano-head 370B (S12). When a hole is bored with the side A galvano-head 370A (YES in the step S14), it is also judged whether or not the hole boring process should be conducted by the side A galvano-head 370A (step S16) at the timing where the laser beam is supplied from the laser 360 and the hole boring process is conducted by the side B galvano-head 370B which is the other galvano-head.

Here, when the boring is not conducted (NO in the step S16), the rotating positions (scanning position) of the X axis motor 374X and Y axis motor 374Y are set (S18) to radiate the laser beam to the position deviated from the substrate 310, namely to the area outside the processing object area of the multilayer printed wiring board with the galvano-mirrors 372X, 372Y. On the other hand, when the boring is conducted (YES in the step S16), the rotating positions (scanning positions) of the X axis motor 374X, Y axis motor 374Y are calculated to radiate the laser beam to the coordinates positions of the target holes with the galvano-mirrors 372X, 372Y (S20, S22). In the case of processing with the side B galvano-head 370B (NO in S14), the similar processes (S26, S28, S30, S32) are conducted. When above processes are completed for the coordinates of all holes of the actual processing data (YES in S34), all processes are completed.

Subsequently, manufacturing of the multilayer printed wiring board utilizing the multilayer printed wiring board manufacturing apparatus in relation to the third embodiment of the present invention will be explained with reference to FIG. 4 and FIG. 5 which have also been referred to for explanation about the manufacturing process of the first embodiment.

The processes (A) to (C) are similar to the first embodiment and the same explanation is not repeated here. After completion of the process (C), the substrate 10 is placed on the X-Y table 380 shown in FIG. 12 and the pulse beam of 50 μsec is radiated to the substrate 10 in an output of 400 W from the laser oscillator 360. This light beam forms a hole 20 for via hole to the bonding agent layer 16 of the substrate (refer to the process (D)).

In this embodiment, 5000 holes are bored at random on the substrate (500 mm×500 mm). Here, as explained above, the scanning area of respective galvano-mirrors is 30×30 mm as explained above and the positioning speed 400 points/sec within the scanning area. On the other hand, the number of step areas of the X-Y table 380 is 289 (17×17). The moving speed of the X-Y table 380 is 15000 mm/min. Meanwhile, the recognizing time of the four target marks 11 by the CCD camera 382 is 9 seconds including the moving time of the table 380.

When the substrate 10 is processed by this manufacturing apparatus, the processing time is 134 seconds. In the manufacturing apparatus in the first and second embodiments in which only one galvano-head is used, the processing time is 269.5 seconds. As explained above, the processing time can be reduced to a half in the present invention without changing the table size. The explanation about the processes (E) to (H) is not repeated here because it is similar to that in the first embodiment.

Figure 16:
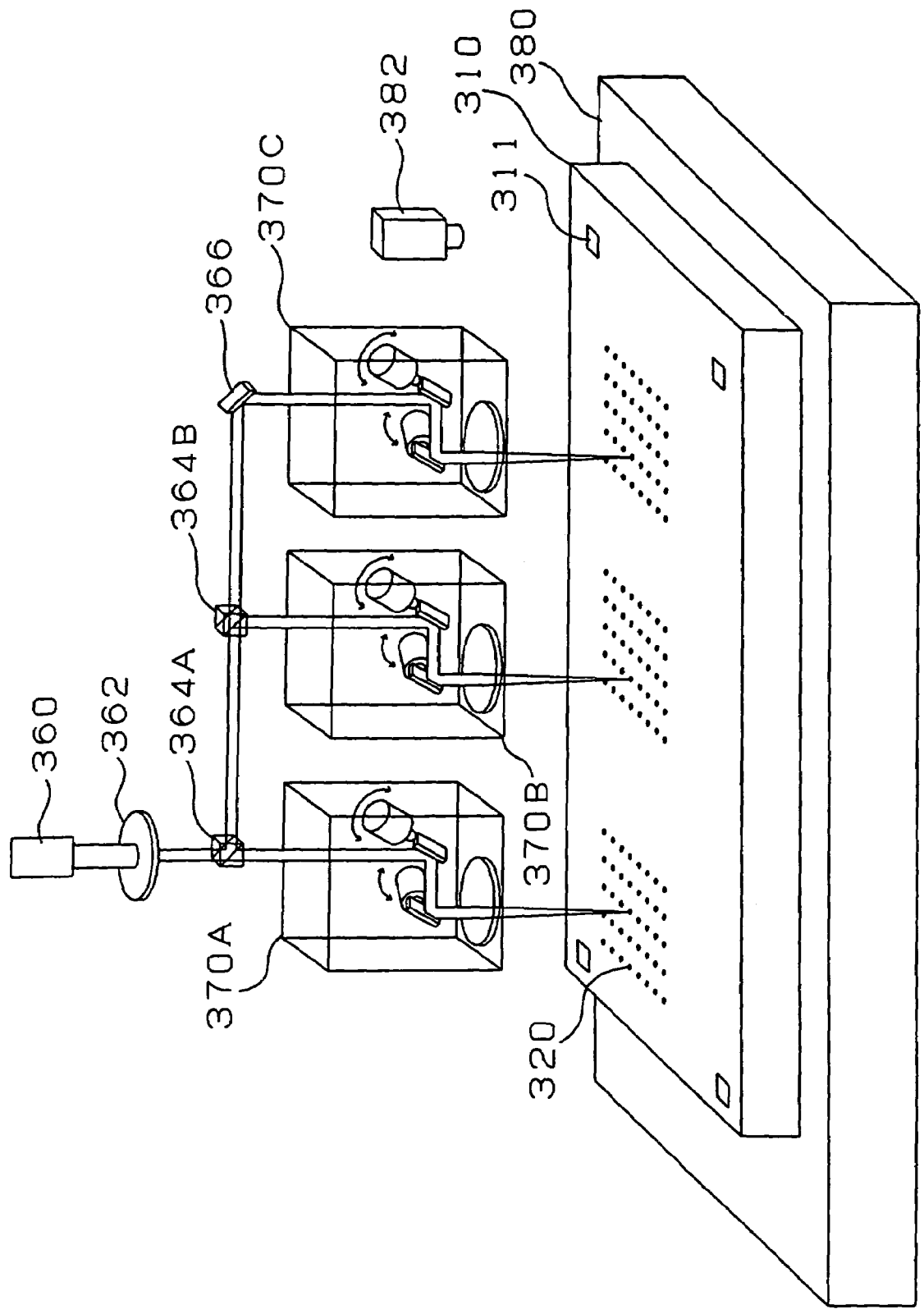
FIG. 16 is a schematic diagram of a multilayer printed wiring board manufacturing apparatus in relation to a modification example of the third embodiment of the present invention.

Subsequently, the manufacturing apparatus in relation to the modification example of the third embodiment of the present invention will be explained with reference to FIG. 16. In the third embodiment explained with reference to FIG. 12, two units of the galvano-heads 370A, 370B are provided. Meanwhile, in the third embodiment, three units of the galvano-heads 370A, 370B, 370C are provided. In this example of modification, the light beam having the power equal to ⅓ the power of the light from the laser 360 is supplied to the side A galvano-head 370A via the beam splitter 364A which distributes the incident light beam in the power ratio of 1:2. Moreover, the light beam having the power equal to ⅓ the power of the beam from the beam splitter 364A is supplied to the side B galvano-head 370B via the beam splitter 364A which distributes the beam in the power ratio of 1:1 and moreover the light beam having the power equal to ⅓ is also supplied to the side C galvano-head 370C by means of the mirror 366.

In the manufacturing apparatus of the modification example of this third embodiment, the hole boring time by laser can be reduced to ⅓. In this embodiment, three units of the galvano-head are used but it is also possible to use four or more units of galvano-head by adjusting the power ratio of the beams distributed by the beam splitter.

Figure 17:
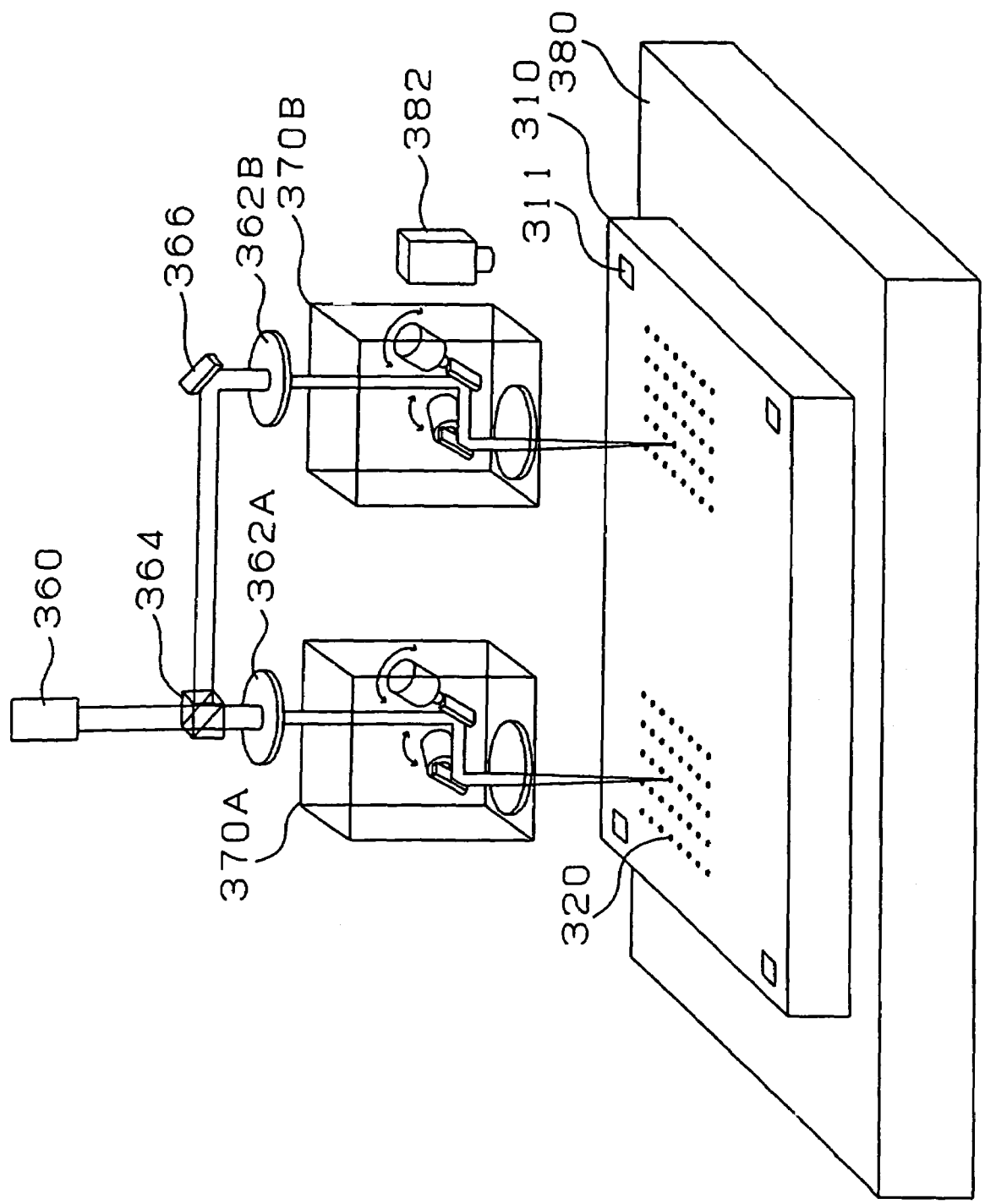
FIG. 17 is a schematic diagram of a multilayer printed wiring board in relation to another modification example of the third embodiment of the present invention.

Next, the manufacturing apparatus in relation to the other modification example of the third embodiment of the present invention will be explained with reference to FIG. 17. In the third embodiment explained with reference to FIG. 12, a unit of transfer mask 362 is arranged between the laser oscillator 360 and beam splitter 364. On the other hand, in the manufacturing apparatus of the third embodiment, the transfer masks 362A, 362B are arranged respectively between the beam splitter 364 and galvano-heads 370A, 370B.

In the structure of the profile explained above with reference to FIG. 12, only one transfer mask 362 is used, however, the optical path length up to the substrate 310 from the transfer mask 362 in the case of the side A galvano-head 370A is different from that in the case of side B galvano-head 370B. Therefore, it is required that the distance up to the side A galvano-head 370A from the substrate 310 is set different from the distance up to the side B galvano-head 370B. Meanwhile, in the structure of the other modification example shown in FIG. 17, the optical path length up to the substrate 310 from the transfer mask 362 is equal in both the case of the side A galvano-head 370A and the side B galvano-head 370B. Therefore, the distance from the substrate 310 to the side A galvano-head 370A can be set equal to the distance up to the side B galvano-head 370B.

In the second and third embodiments explained above, the present invention is applied to a multilayer printed wiring board manufacturing apparatus, however, the present invention can also be applied to various kinds of laser processing apparatuses. Moreover, a galvano-head is used as the scanning head but a polygon mirror can also be used. In addition, the $CO_2$ laser is used as the laser oscillator, but various types of laser may also be used.

According to the apparatus of the third embodiment, the processing speed can be improved by utilizing the X-Y table for placing the single galvano-head of the related art. Namely, it is also possible to prepare a plurality of galvano-heads and provide the laser oscillator to these heads. In this case, the apparatus size such as the X-Y table inevitably increases. However, in the third embodiment, since a single laser oscillator is used, the apparatus size is not increased.

Moreover, the area of the X-Y table can be set to the size of only one work piece by processing only one work piece (multilayer printed wiring board) with two or more scanning heads and thereby the processing speed can be enhanced without increase in size of the apparatus.

EFFECT OF THE INVENTION

As explained above, since the shortened wavelength can be realized by modulating the wavelength of the laser source in the present invention, fine holes may be formed as well as via holes by use of a low price light source.

As explained previously, since several hundreds to several thousands holes can be bored with radiation of laser beam while securing the positional accuracy of the via holes in the present invention, mass production of the multilayer printed wiring board by the laser beam can be realized.

As explained above, since the light can always be applied from the lower side of the positioning marks to accurately read the positioning marks in the present invention even when the X-Y table itself or a drive motor is provided, the boring process by the laser beam can be conducted with higher accuracy.

Moreover, as explained above, since a plurality of galvano-heads are provided even when only one laser source is used in the present invention, the boring speed can be improved without increase in size of the apparatus and thereby low cost laser boring can be realized.

What is claimed is:

1. A multilayer printed wiring board manufacturing method comprising:

forming at least one positioning mark and at least one interlayer insulating agent layer on a multilayer printed wiring board;

providing a manufacturing apparatus including a processing laser source configured to emit a laser beam, a scanning head configured to deflect the laser beam in X-Y directions, a camera configured to measure a position of the at least one positioning mark, and an X-Y table configured to hold the multilayer printed wiring board, and having a light source embedded in an area corresponding to the at least one positioning mark, the light source being configured to emit light;

inputting processing data of the multilayer printed wiring board to said manufacturing apparatus;

measuring with the camera the position of the at least one positioning mark by recognizing a silhouette of the at least one positioning mark which is generated by the light emitted from the light source of said X-Y table;

correcting the processing data based on the position of the at least one positioning mark;

generating drive data for driving at least one of the scanning head and the X-Y table; and controlling at least one of the X-Y table and the scanning head based on said drive data to apply the laser beam to the multilayer printed wiring board to form a hole in the at least one interlayer insulating agent layer, wherein the at least one interlayer insulating agent layer comprises a plurality of interlayer insulating agent layers including an upper layer and a lower layer, the at least one positioning mark comprises a plurality of positioning marks including a positioning mark covered by the upper layer and a positioning mark covered by the lower layer, and the positioning mark of the upper layer is deviated from the positioning mark of the lower layer.

2. The multilayer printed wiring board manufacturing method according to claim 1, wherein said light source comprises an LED.

3. The multilayer printed wiring board manufacturing method according to claim 1, wherein the light source comprises an LED configured to emit green light.

4. The multilayer printed wiring board manufacturing method according to claim 1, wherein the at least one positioning mark and a conductive circuit are formed simultaneously.

5. The multilayer printed wiring board manufacturing method according to claim 1, wherein the positioning mark of the upper layer and the positioning mark of the lower layer are simultaneously illuminated with the light emitted from the light source through an aperture formed in the X-Y table.

6. The multilayer printed wiring board manufacturing method according to claim 5, wherein the light source comprises an LED.

7. The multilayer printed wiring board manufacturing method according to claim 5, wherein the light source comprises an LED configured to emit green light.

8. The multilayer printed wiring board manufacturing method according to claim 5, wherein the at least one positioning mark and a conductive circuit are formed simultaneously.

9. A multilayer printed wiring board manufacturing method comprising:

forming at least one positioning mark and at least one interlayer insulating agent layer on a multilayer printed wiring board;

providing a manufacturing apparatus including a processing laser source configured to emit a laser beam, a scanning head configured to deflect the laser beam in X-Y directions, a camera configured to measure a position of the at least one positioning mark, and an X-Y table configured to hold the multilayer printed wiring board, and having a light source embedded in an area corresponding to the at least one positioning mark, the light source being configured to emit light;

inputting processing data of the multilayer printed wiring board to said manufacturing apparatus;

measuring with the camera the position of the at least one positioning mark by recognizing a silhouette of the at least one positioning mark which is generated by the light emitted from the light source of said X-Y table;

correcting the processing data based on the position of the at least one positioning mark;

generating drive data for driving at least one of the scanning head and the X-Y table; and controlling at least one of the X-Y table and the scanning head based on said drive data to apply the laser beam to the multilayer printed wiring board to form a hole in the at least one interlayer insulating agent layer, wherein the at least one interlayer insulating agent layer comprises a plurality of interlayer insulating agent layers including an upper layer and a lower layer, the at least one positioning mark comprises a plurality of positioning marks including a first positioning mark covered by the upper layer and a second positioning mark covered by the lower layer, and the first and second positioning marks are simultaneously illuminated with the light emitted from the light source through an aperture formed in the X-Y table.

* * * * *